(12) United States Patent
Seo et al.

(10) Patent No.: US 8,456,079 B2
(45) Date of Patent: Jun. 4, 2013

(54) LUMINOUS DEVICE

(75) Inventors: Satoshi Seo, Atsugi (JP); Keitaro Imai, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 83 days.

(21) Appl. No.: 13/011,093

(22) Filed: Jan. 21, 2011

(65) Prior Publication Data

US 2011/0115369 A1 May 19, 2011

Related U.S. Application Data

(62) Division of application No. 12/702,606, filed on Feb. 9, 2010, now Pat. No. 7,880,378, and a division of application No. 10/219,297, filed on Aug. 16, 2002, now Pat. No. 7,701,130.

(30) Foreign Application Priority Data

Aug. 24, 2001 (JP) ................................. 2001-255262

(51) Int. Cl.
    *H05B 33/00* (2006.01)
(52) U.S. Cl.
    USPC ............................. 313/504; 313/506; 428/917
(58) Field of Classification Search
    None
    See application file for complete search history.

(56) References Cited

U.S. PATENT DOCUMENTS

| 4,734,618 | A | 3/1988 | Matsudaira et al. |
| 5,602,445 | A | 2/1997 | Solanki et al. |
| 5,700,591 | A | 12/1997 | Okajima et al. |
| 5,747,929 | A | 5/1998 | Kato et al. |
| 5,882,761 | A | 3/1999 | Kawami et al. |
| 6,025,677 | A | 2/2000 | Moss, III et al. |
| 6,049,167 | A | 4/2000 | Onitsuka et al. |
| 6,284,393 | B1 | 9/2001 | Hosokawa et al. |
| 6,288,487 | B1 | 9/2001 | Arai |
| 6,379,824 | B1 | 4/2002 | Hosokawa |

(Continued)

FOREIGN PATENT DOCUMENTS

| EP | 0 776 147 | 5/1997 |
| EP | 0 993 236 | 4/2000 |

(Continued)

OTHER PUBLICATIONS

Tang et al., "Organic Electroluminescent Diodes", Applied Physics Letters, vol. 51, No. 12, Sep. 21, 1987, 913-915.

(Continued)

*Primary Examiner* — Ashok Patel
(74) *Attorney, Agent, or Firm* — Eric J. Robinson; Robinson Intellectual Property Law Office, P.C.

(57) ABSTRACT

Provided is a means for improving the capability of injecting electrons from a cathode in a luminous element and solving problems about the production process thereof. In the present invention, a material having a smaller work function than a cathode material is used to form an inorganic conductive layer between the cathode and an organic compound layer. In this way, the capability of injecting electrons from the cathode can be improved. Furthermore, the film thereof can be thicker than that of a conventional cathode buffer layer formed by using an insulating material. Therefore, the film thickness can easily be controlled, and a decrease in production costs and an improvement in yield can be achieved.

17 Claims, 28 Drawing Sheets

U.S. PATENT DOCUMENTS

| | | | |
|---|---|---|---|
| 6,416,888 | B1 | 7/2002 | Kawamura et al. |
| 6,551,724 | B2 | 4/2003 | Ishii et al. |
| 6,617,054 | B2 | 9/2003 | Hosokawa |
| 6,635,365 | B2 | 10/2003 | Kawamura et al. |
| 6,642,544 | B1 | 11/2003 | Hamada et al. |
| 6,831,408 | B2 | 12/2004 | Hirano et al. |
| 2005/0136784 | A1* | 6/2005 | Seo et al. ............ 445/24 |

FOREIGN PATENT DOCUMENTS

| | | |
|---|---|---|
| EP | 1 083 776 | 3/2001 |
| EP | 1 096 835 | 5/2001 |
| EP | 1 793 654 | 6/2007 |
| JP | 08-008065 | 1/1996 |
| JP | 08-222375 | 8/1996 |
| JP | 09-148066 | 6/1997 |
| JP | 11-297478 | 10/1999 |
| JP | 2000-164359 * | 6/2000 |
| JP | 2000-235893 | 8/2000 |
| JP | 2000-243567 | 9/2000 |
| JP | 2000-268969 | 9/2000 |
| JP | 2001-043980 | 2/2001 |
| KR | 2000-0014145 | 3/2000 |
| WO | WO 01/06576 | 1/2001 |

OTHER PUBLICATIONS

Hung et al., "Enhanced Electron Injection in Organic Electroluminescence Devices Using an Al/LiF Electrode," Appl. Phys. Lett., 70(2), Jan. 13, 1997, pp. 152-154.

Baldo et al., "Very High-Efficiency Green Organic Light-Emitting Devices Based on Electrophosphorescence," Applied Physics Letters, vol. 75, No. 1, Jul. 5, 1999, pp. 4-6.

Kofuji, "Development of Organic EL Element to Single Layer Type," Electronic Journal $6^{th}$ FPD Seminar, Jun. 29, 1999, pp. 83-88.

Tsutsui et al., "Electroluminescence in Organic Thin Films," Photochemical Processes in Organized Molecular Systems, 1991, pp. 437-450.

Baldo et al., "Highly Efficient Phosphorescent Emission from Organic Electroluminescent Devices," Letters to Nature, vol. 395, Sep. 10, 1998, pp. 151-154.

Tsutsui et al., High Quantum Efficiency in Organic Light-Emitting Devices with Iridium-Complex as a Triplet Emissive Center, Japanese Journal of Applied Physics, vol. 38, Part 2, No. 12B, Dec. 15, 1999, pp. L1502-L1504.

English Translation of Official Communication, Taiwanese Patent Office, Taiwanese Patent Application No. 745787, Aug. 13, 2003.

Office Action (Chinese Application No. 02142069.6 dated Dec. 1, 2006).

Office Action (Korean Patent Application No. 2002-050295) dated May 29, 2008.

Office Action (Korean Patent Application No. 2002-0050295) dated Jan. 5, 2009.

* cited by examiner

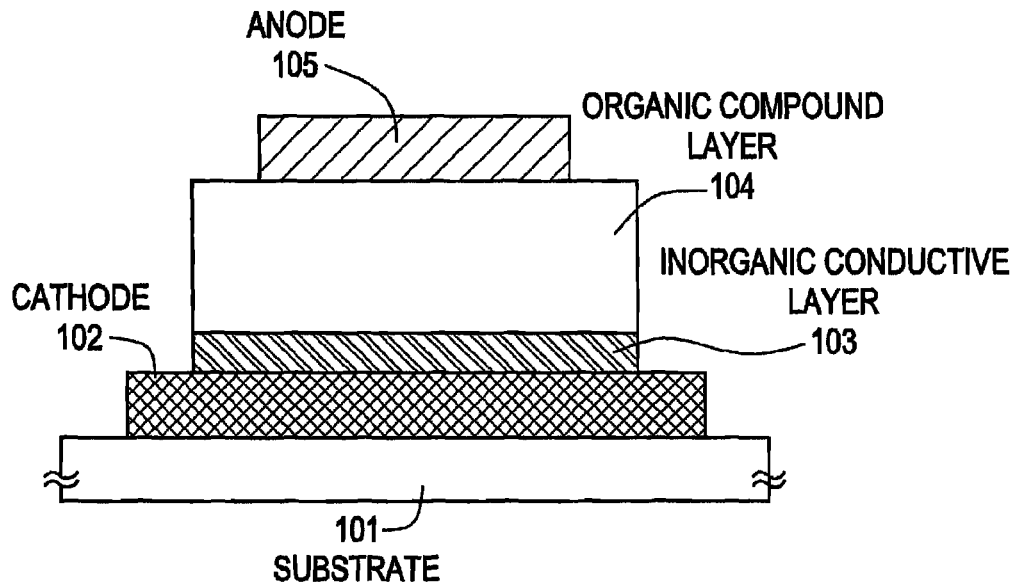
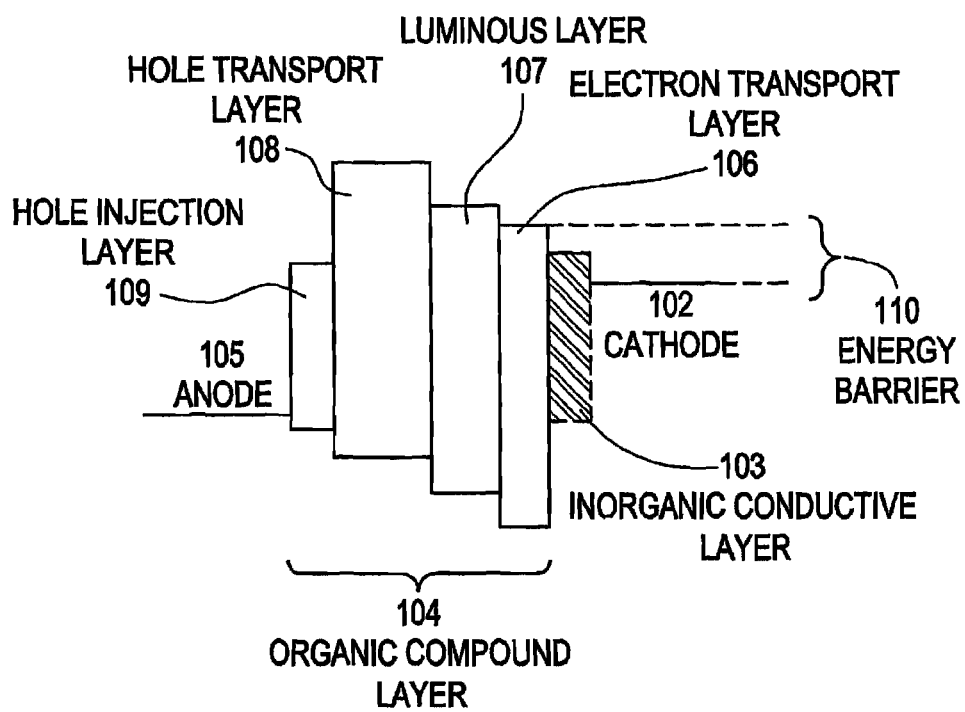

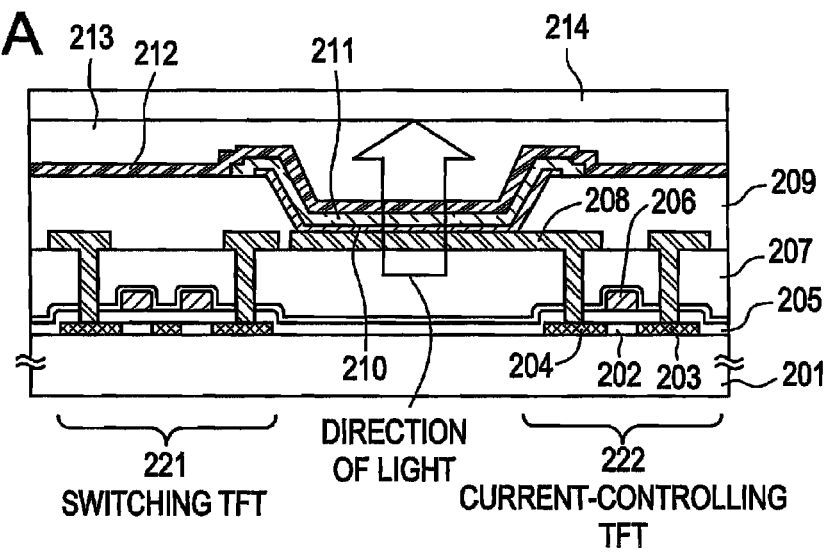
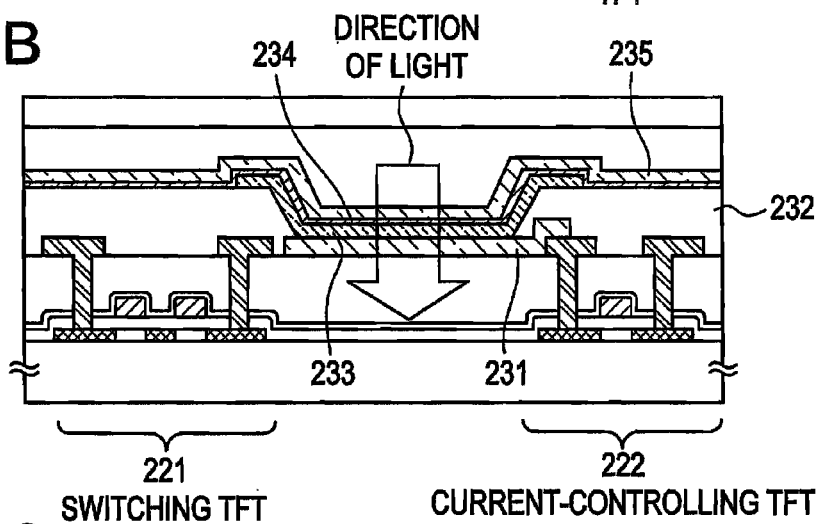
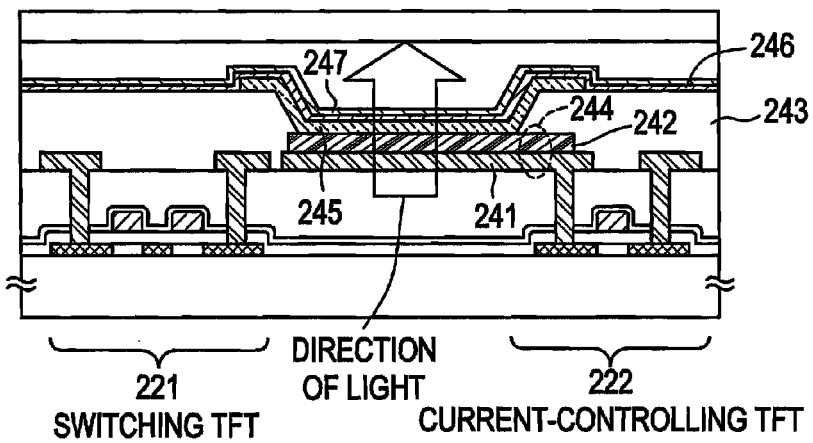

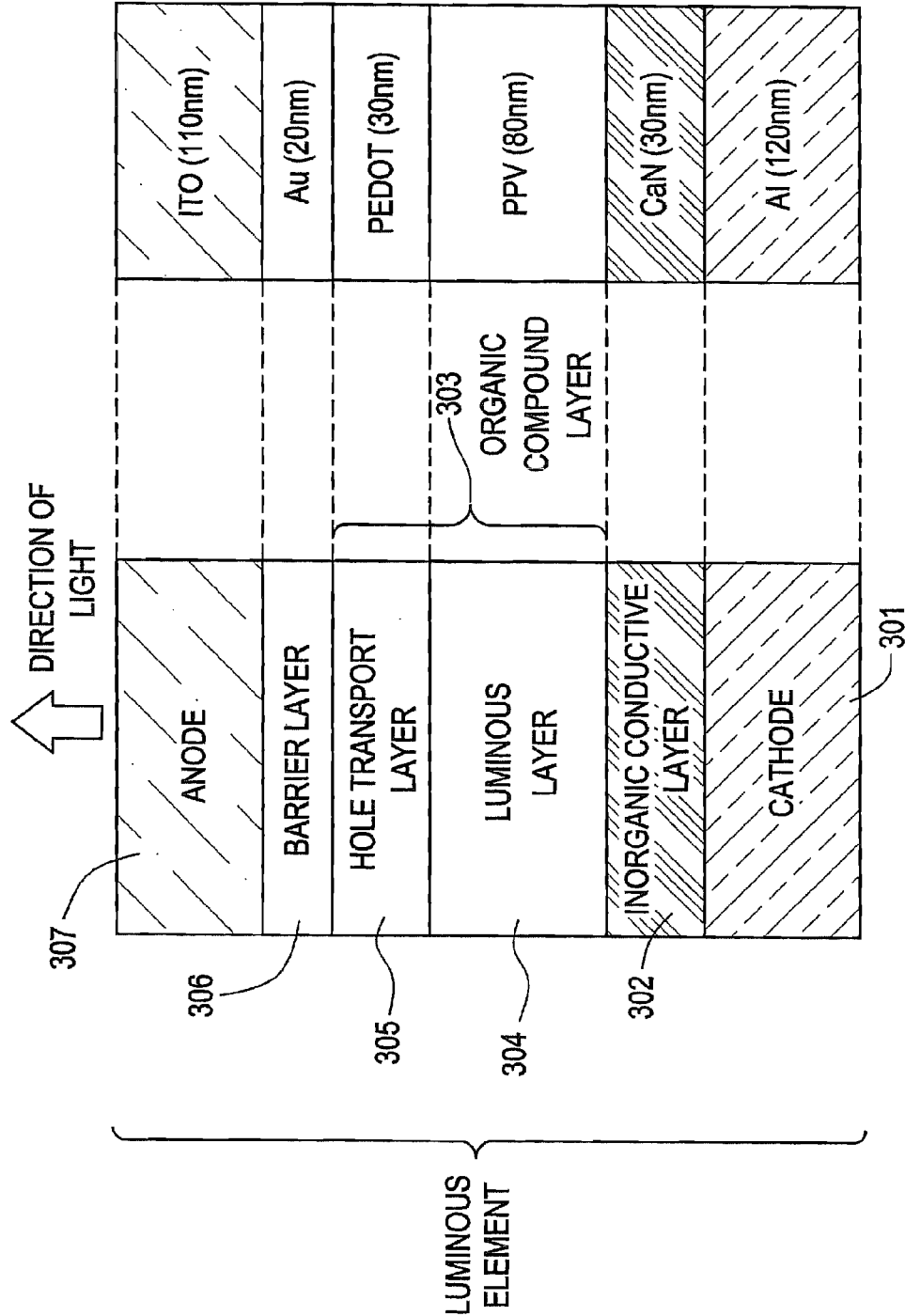

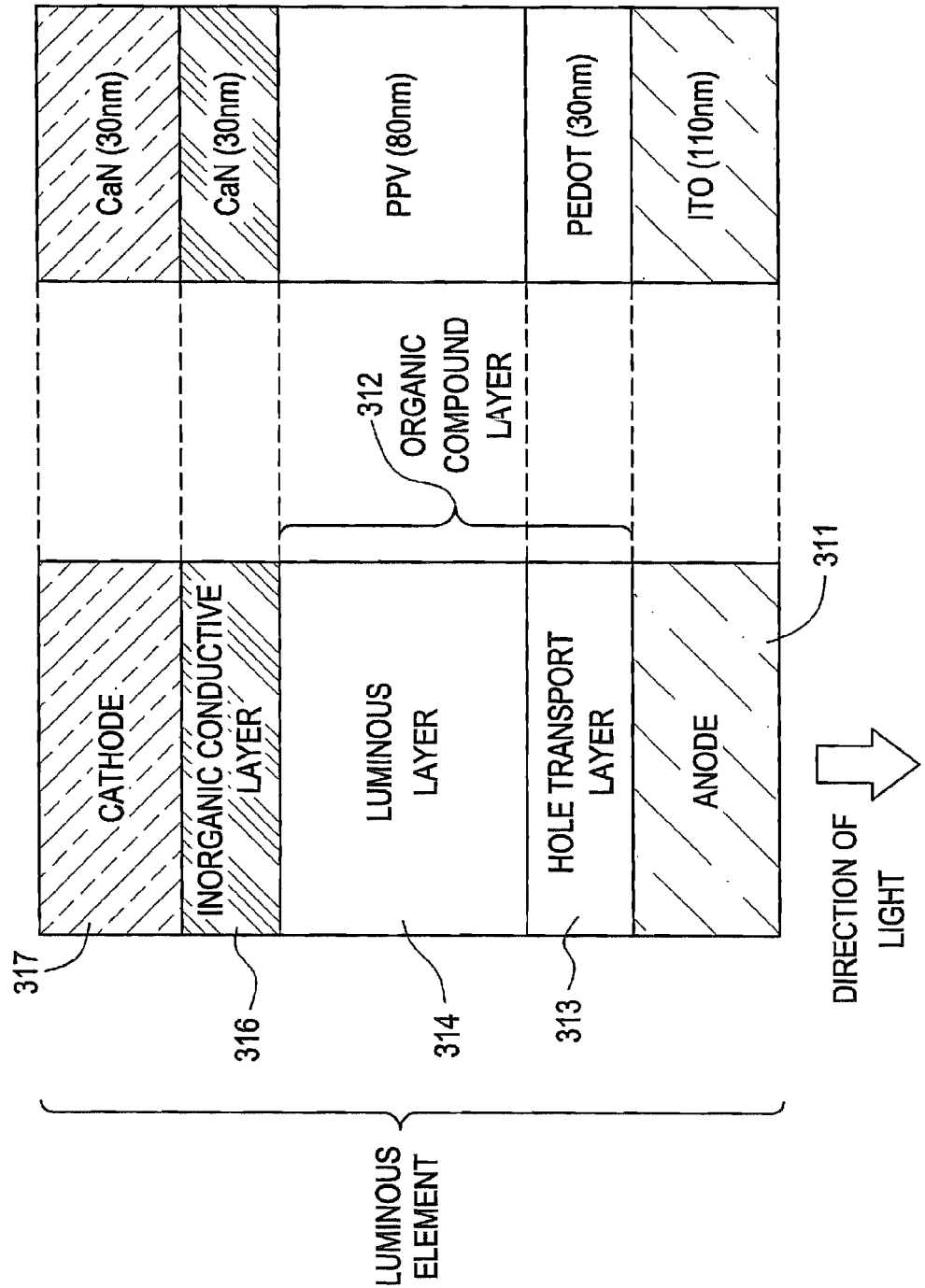

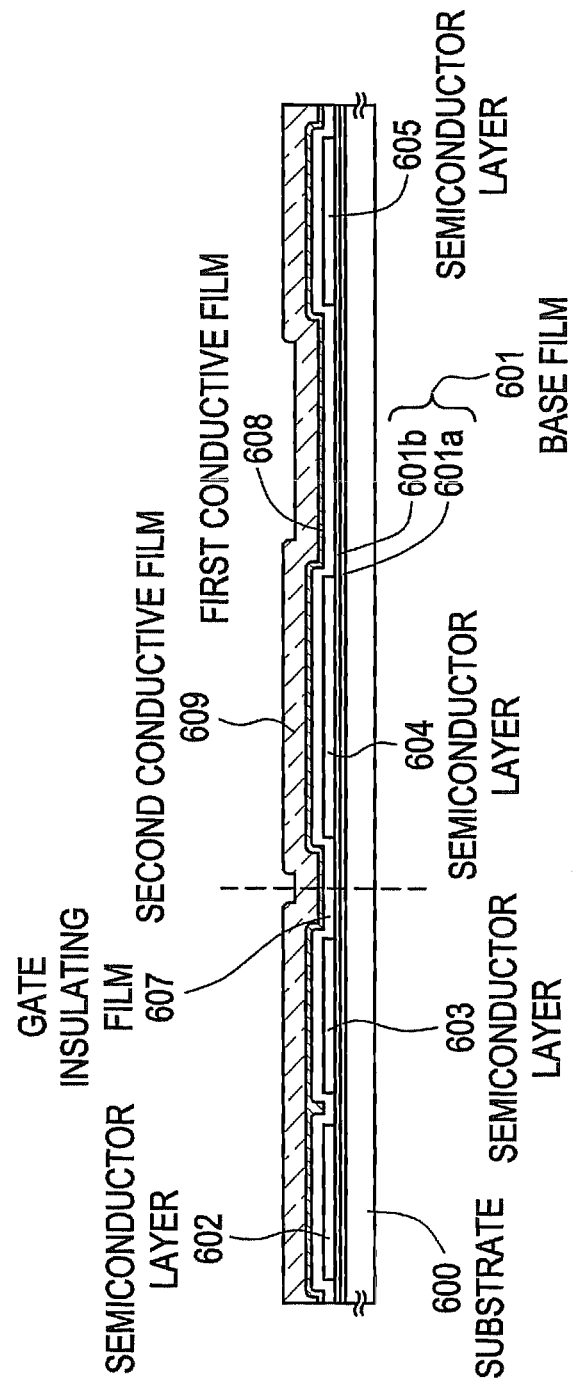

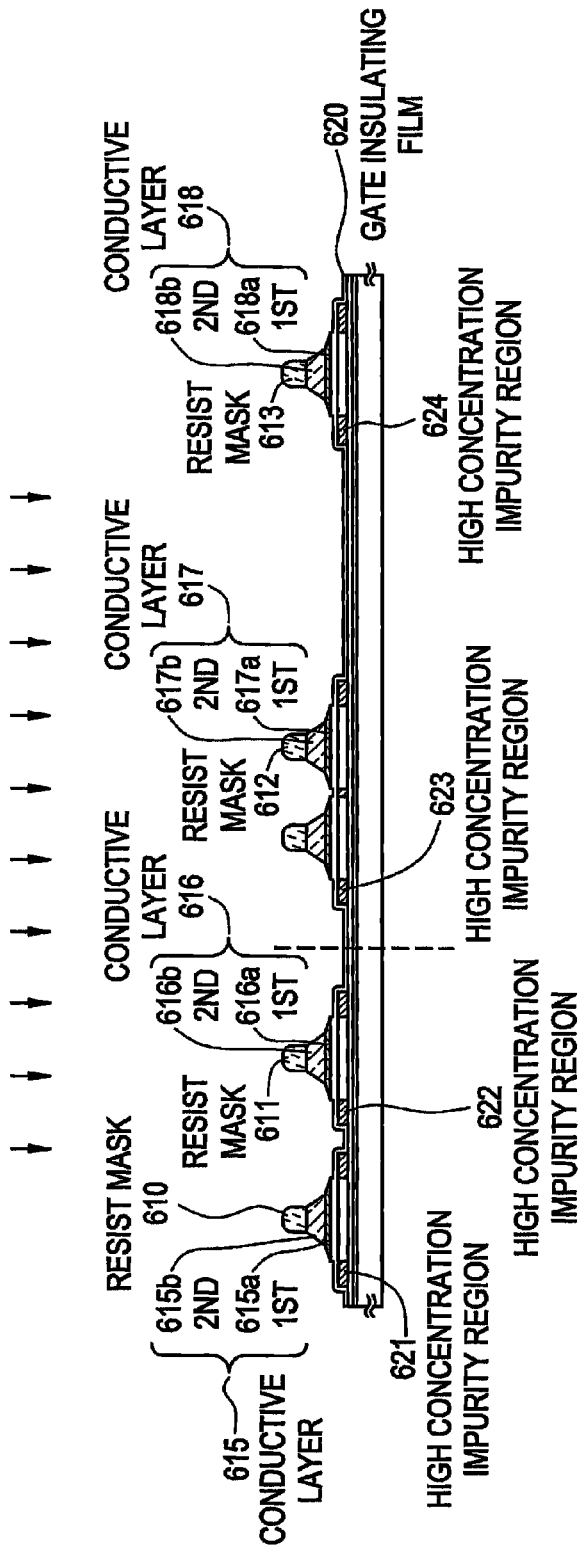

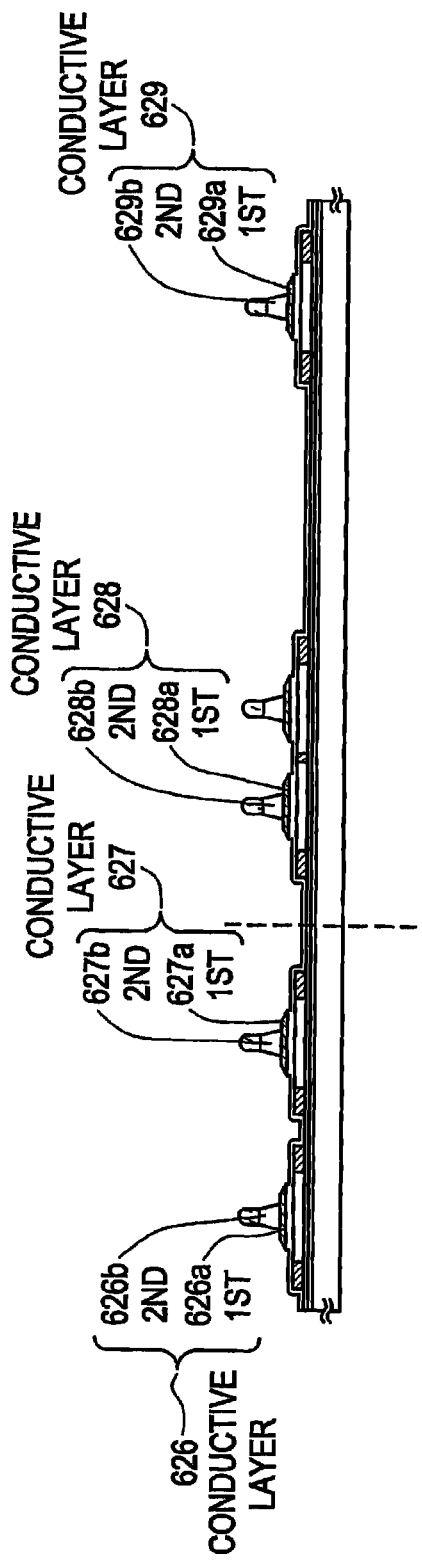

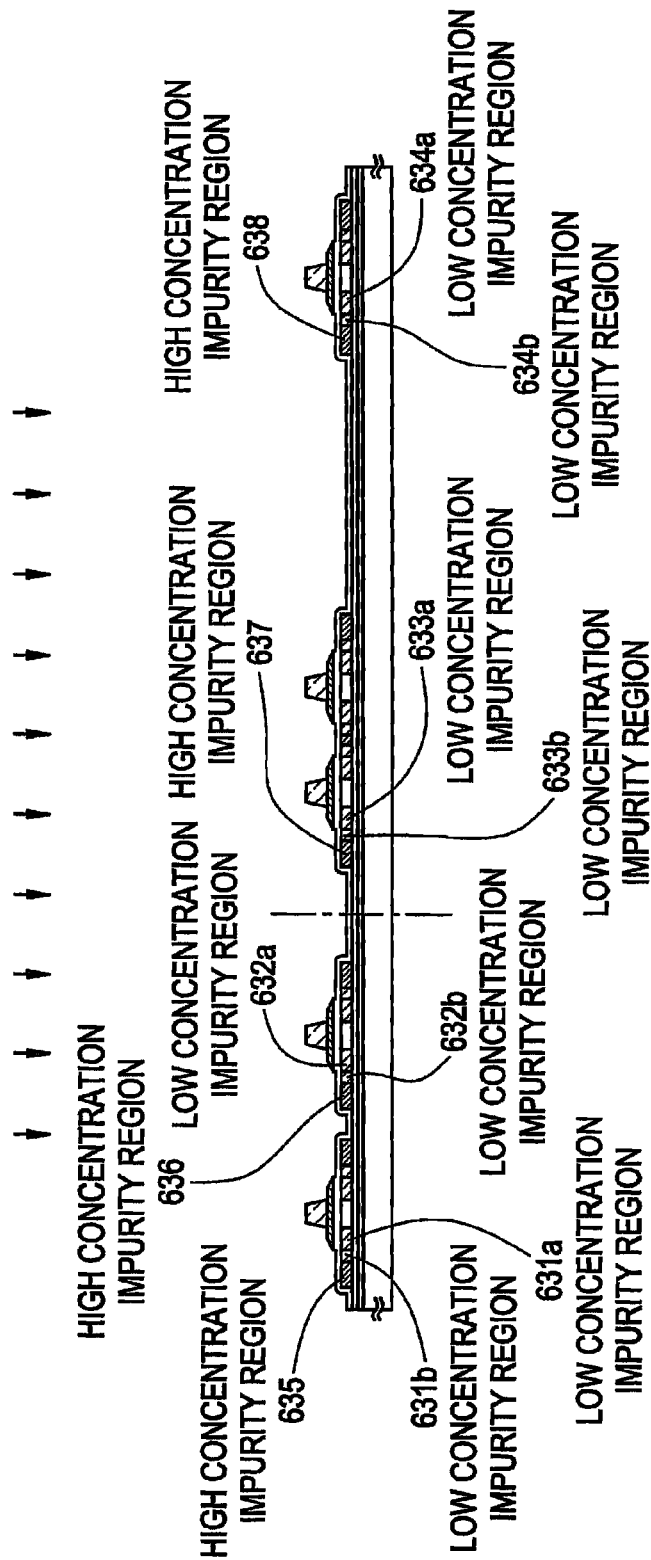

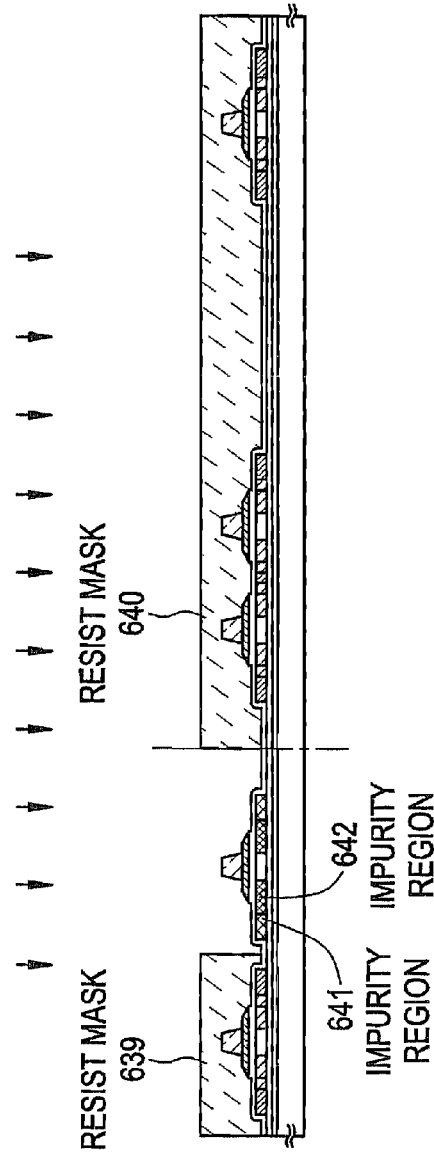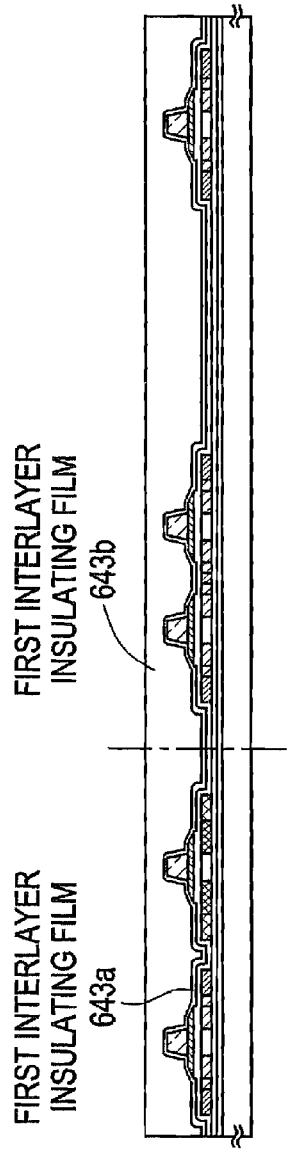

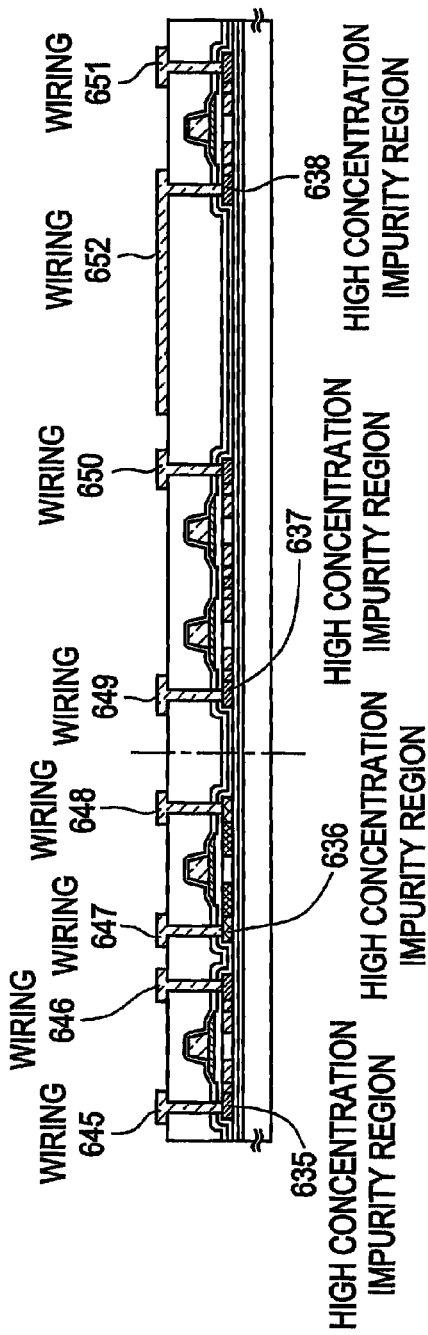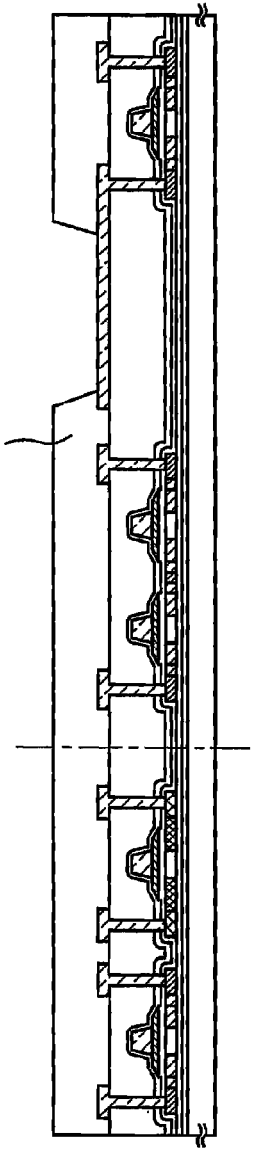

FORMATION OF INORGANIC CONDUCTIVE LAYER

INORGANIC CONDUCTIVE LAYER 654

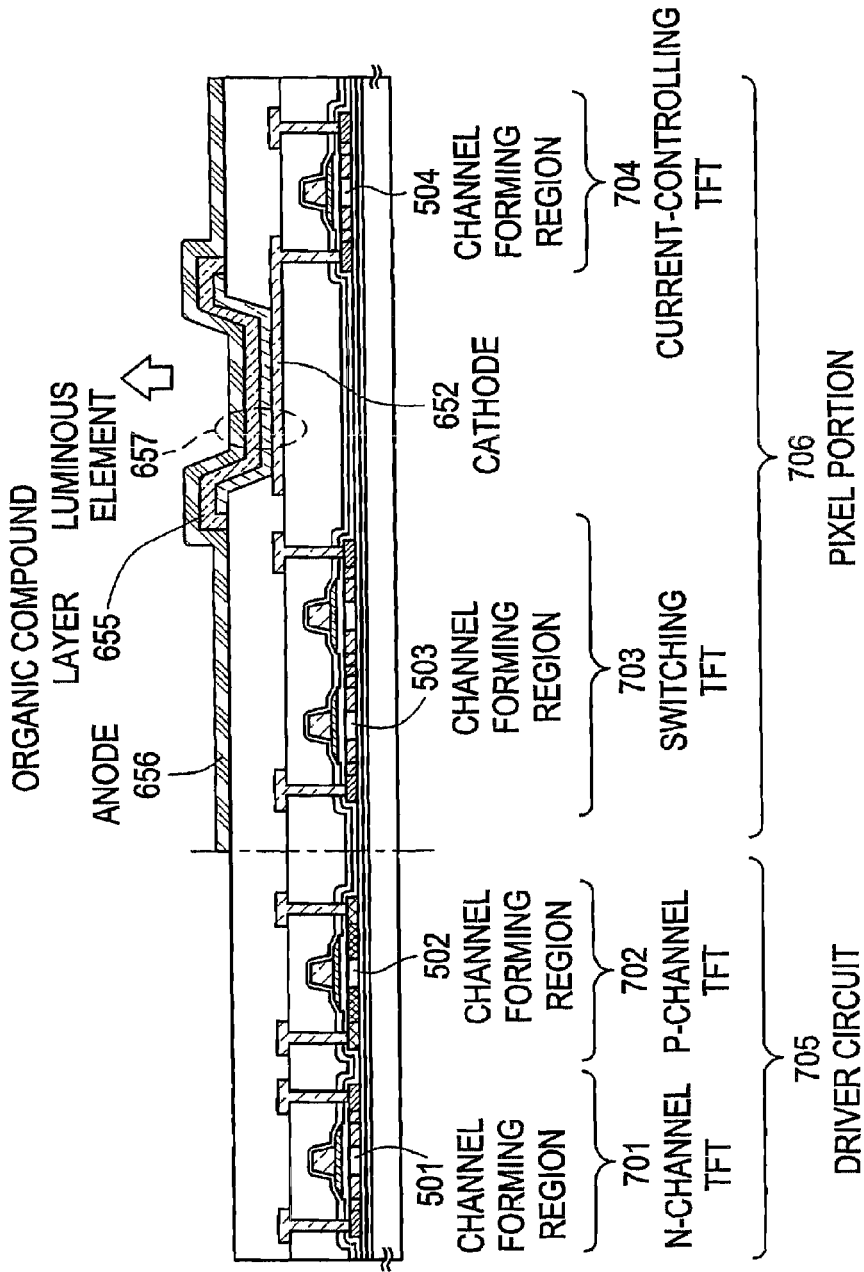

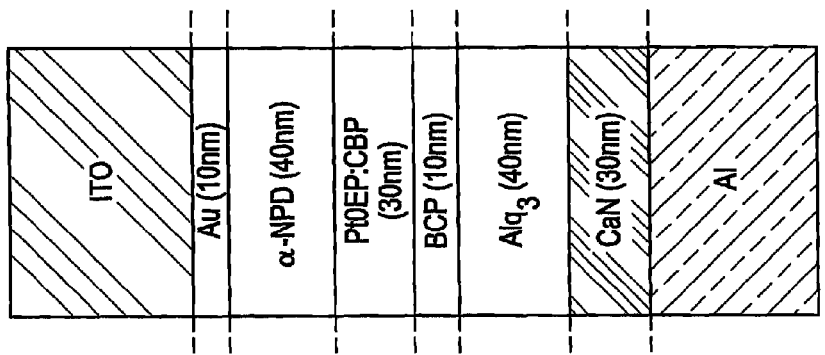
FIG. 9A ELEMENT STRUCTURE
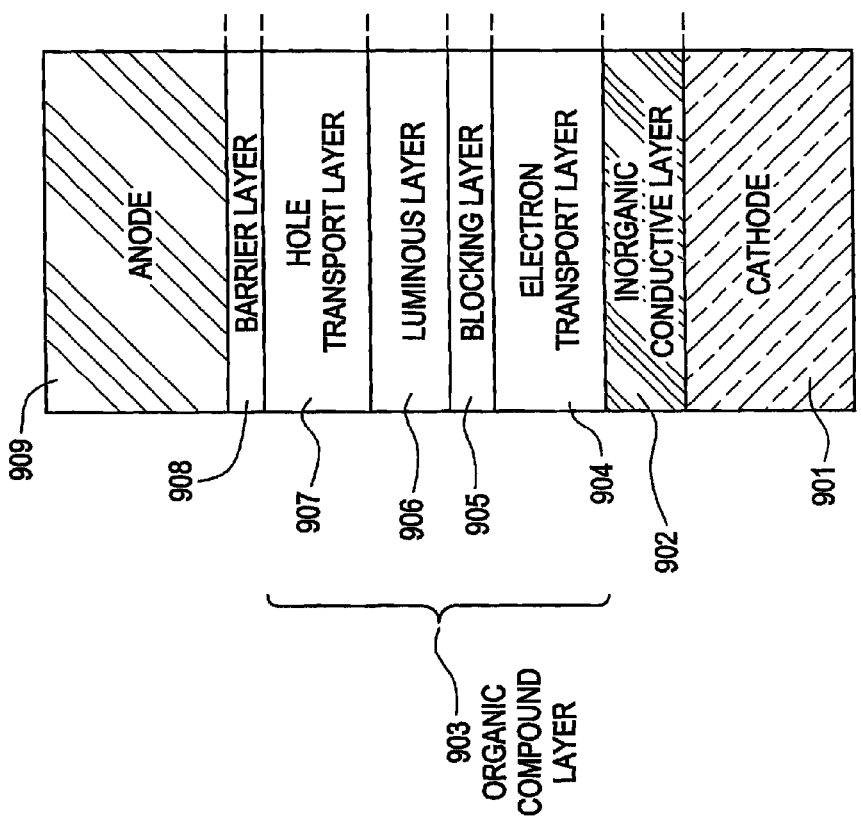
FIG. 9B LUMINOUS ELEMENT (R)

LUMINOUS ELEMENT (G)

LUMINOUS ELEMENT (B)

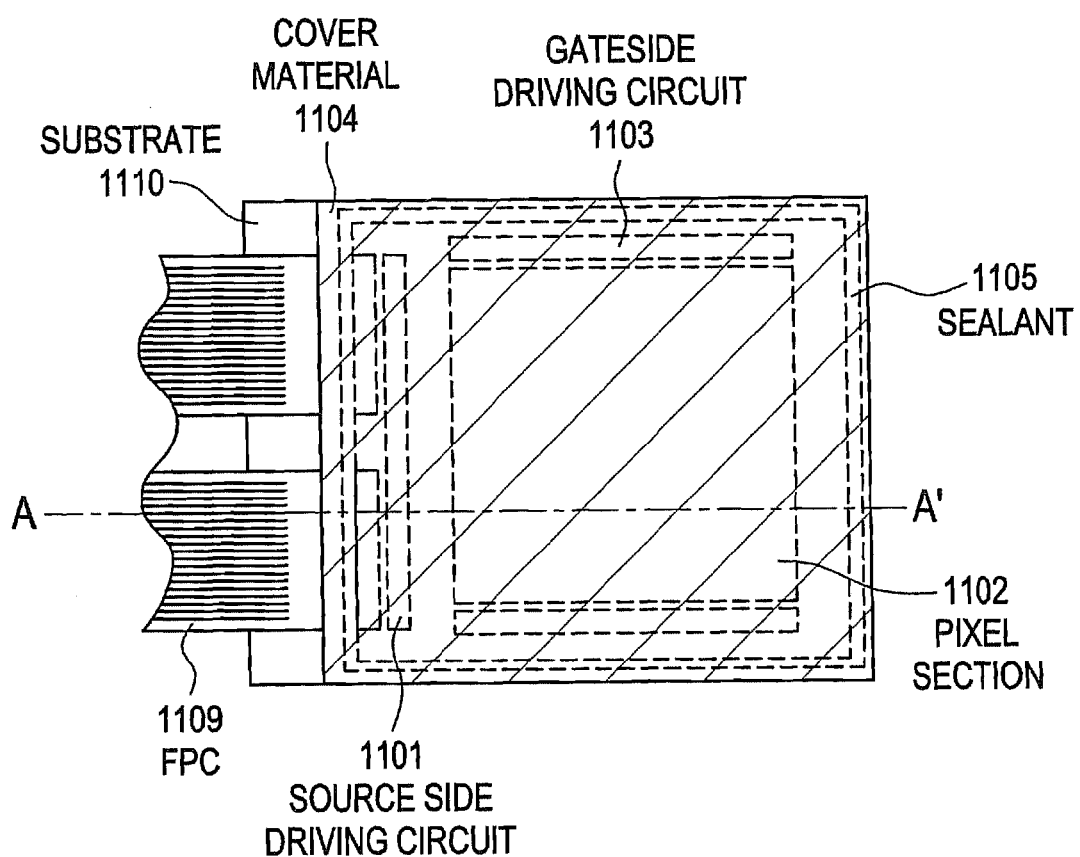

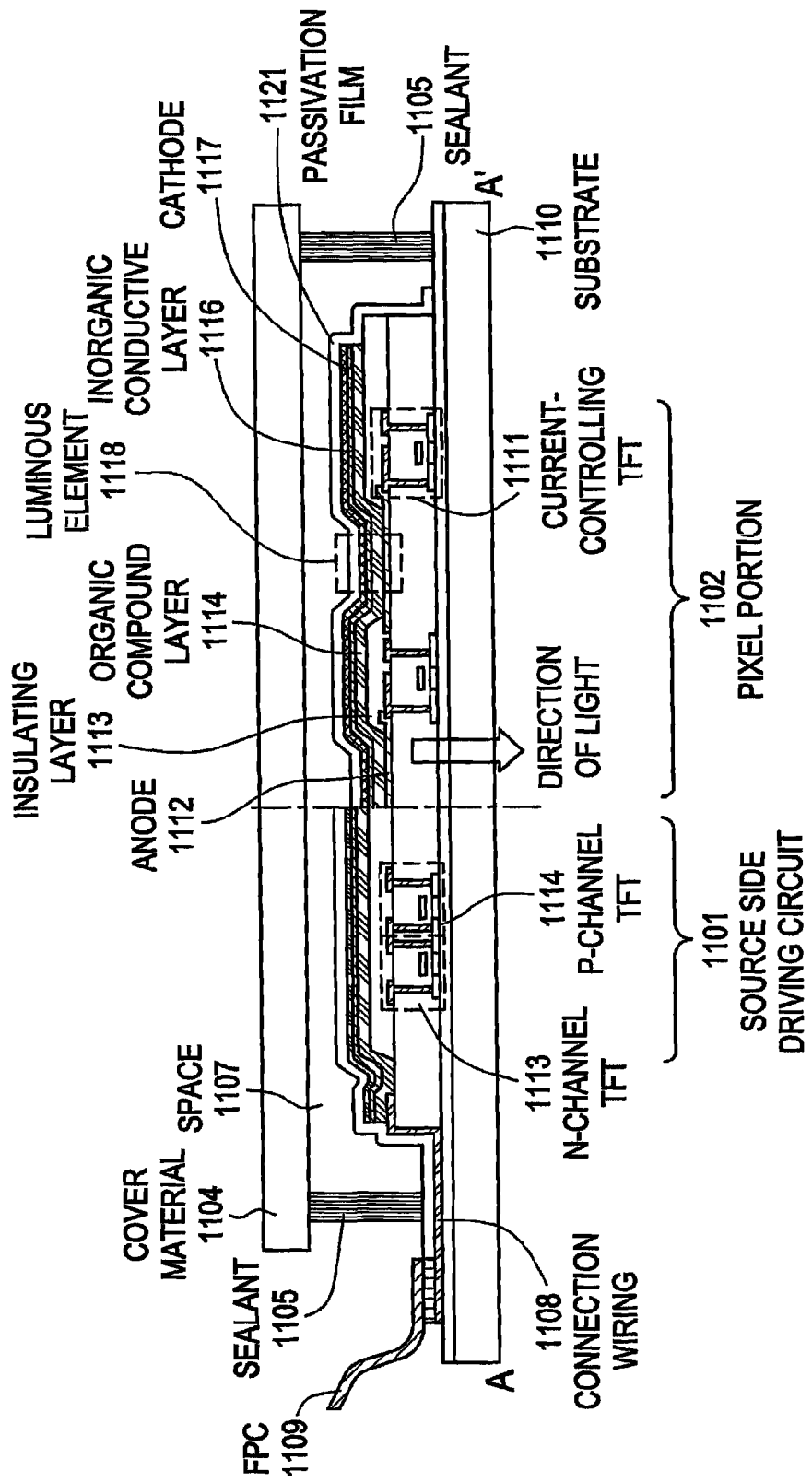

Luminance vs. Current Density

Luminance vs. Voltage

Luminance vs. Current Density

Luminance vs. Voltage

LUMINOUS DEVICE

BACKGROUND OF THE INVENTION

1. Field of the Invention

The present invention relates to a luminous device using a luminous element which has a film containing an organic compound (hereinafter referred to as an "organic compound layer") between a pair of electrodes and which can give fluorescence or luminescence by receiving an electric field. The luminous device referred to in the present specification is an image display device, a luminescent device or a light source. Additionally, the following are included in examples of the luminous device: a module wherein a connector, for example, a flexible printed circuit (FPC) or a tape automated bonding (TAB) tape, or a tape carrier package (TCP)) is set up onto a luminous element; a module wherein a printed wiring board is set to the tip of a TAB tape or a TCP; and a module wherein integrated circuits (IC) are directly mounted on a luminous element in a chip on glass (COG) manner.

2. Related Art

A luminous element is an element which emits light by receiving an electric field. It is said that the luminescence mechanism thereof is based on the following: by applying a voltage to an organic compound layer sandwiched between electrodes, electrons injected from the cathode and holes injected from the anode are recombined in the organic compound layer to form molecules in an exciting state (hereinafter referred to as "molecular excimers"); and energy is radiated when the molecular excimers return to the ground state thereof.

The kind of the molecular excimers which are made from the organic compound may be a singlet exciting state excimer or a triplet exciting state excimer. In the present specification, luminescence (that is, light emission) may be based on the contribution of any one of the two.

In such a luminous element, its organic compound layer is usually made of a thin film having a thickness below 1 μm. The luminous element is a spontaneous light type element, wherein the organic compound layer itself emits light. Therefore, backlight, which is used in conventional liquid crystal displays, is unnecessary. As a result, the luminous element has a great advantage that it can be produced into a thin and light form.

The time from the injection of carriers to the recombination thereof in the organic compound layer having a thickness of about 100 to 200 nm is about several tens nanoseconds in light of carrier mobility in the organic compound layer. A time up to luminescence, which includes the step from the recombination of the carrier to luminescence, is a time in order of microseconds or less. Therefore, the luminous element also has an advantage that the response thereof is very rapid.

Since a luminous element is of a carrier injection type, the luminous element can be driven by DC voltage and noises are not easily generated. About driving voltage, a sufficient brightness of 100 cd/m$^2$ is attained at 5.5 V by making an organic compound layer to a super-thin film having a uniform thickness of about 100 nm, selecting an electrode material so as to make a carrier injection barrier against the organic compound layer small, and further introducing a heterostructure (bilayer structure) (document 1: C. W. Tang and S. A. VanSlyke, " Organic electroluminescent diodes " Applied Physics letters, vol. 51, No. 12, 913-915 (1987)).

In light of such properties such as thinness and lightness, high-speed response, and DC low voltage driving ability, attention is paid to a luminous element as a flat panel display element in the next generation. Since the luminous element is of a spontaneous light type and has a wide field angle, the luminous element is relatively easy to watch. Thus, it can be considered that the luminous element is effective as an element used in a display screen in portable devices.

In luminous devices formed by arranging such luminous elements in a matrix form, driving methods called passive matrix driving (simple matrix type) and active matrix driving (active matrix type) can be used. However, in the case in which the density of pixels increases, it is considered that the active matrix type wherein a switch is fitted to each pixel (or each dot) is more profitable since lower voltage driving can be attained.

Incidentally, in such a luminous element, a metal material having a low work function is used as a cathode since electron injection is facilitated. Hitherto, the following have been investigated as materials satisfying practical properties: magnesium alloy such as alloy of Mg and Ag, and aluminum alloy such as alloy of Al and Li. All of the material systems are easily oxidized by water content in the atmosphere, so that a dark spot, which is a luminescence defect of the element, is generated or a rise in voltage occurs. Therefore, a form using some protective film or some sealing structure is necessary as a final form of the element.

In light of the background art of the above-mentioned alloy electrodes, it has been desired to develop more stable cathodes. In recent years, it has been reported that by interposing a cathode buffer layer made of lithium fluoride (LiF) or the like as a super-thin insulating layer (0.5 nm), even an aluminum cathode can give luminescence property equivalent to or more than that of alloy of Mg and Ag, or the like alloy (document 2: L. S. Hung, C. W. Tang and M. G. Mason: Appl. Phys. Lett., 70(2), 13 Jan. (1997).

The mechanism of the property improvement by disposing this cathode buffer layer would be as follows: when LiF constituting the cathode buffer layer is formed to contact Alq$_3$ constituting an electron transport layer of an organic compound layer, the energy band of Alq$_3$ is bent to lower an electron injection barrier.

As described above, in a luminous element composed of an anode, a cathode and an organic compound layer, an invention is made for improving the capability of injecting carriers from the electrode, resulting from an element characteristic of the luminous element.

Hitherto, a simple substance selected from elements belonging to the I group or the II group in the periodic table or a compound containing this substance has been used as a material having a small work function to form a cathode buffer layer between the cathode and the organic compound layer.

However, in the case in which any metal selected from alkali metals and alkali earth metals belonging to the I group or the II group in the periodic table is used alone for the cathode buffer layer, there arises a problem that the metal diffuses to have a bad effect on properties of a TFT connected to the luminous element.

On the other hand, in the case in which the compound containing any element selected from elements belonging to the I group or the II group in the periodic table is used for the cathode buffer layer, a compound of the element and oxygen, fluorine or the like belonging to the XVI or XVII group in the periodic table, which has a large electronegativity, is generally used in order to make work function smaller. However, such a compound is non-conductive and thus electron-injection capability is improved. However, in order that the element characteristic is not deteriorated, it is necessary to make the film thickness of the cathode buffer layer as highly thin as 1 nm or less. Therefore, a scattering in the film thickness is easily generated in respective pixels, and it is difficult to control the film thickness.

SUMMARY OF THE INVENTION

Thus, in order to solve the problems in the case in which a cathode buffer layer is conventionally formed in the production of a luminous element, an object of the present invention is to form a new layer instead thereof so as to improve the capability of injecting electrons from a cathode and further to provide a means for solving the problems in the production.

In the present invention, instead of a conventional cathode buffer layer, the following is formed between a cathode and an organic compound layer: an inorganic conductive layer made of an inorganic compound having a smaller work function than a cathode material and having an electric conductivity.

The inorganic conductive layer formed in the present invention is formed using a conductive inorganic compound comprising an element belonging to the II group in the periodic table and having a smaller function than a cathode material. In this way, an energy barrier between the cathode and the organic compound layer can be relieved. Therefore, the capability of injecting electrons from the cathode can be improved.

By forming the inorganic conductive layer made of the inorganic compound having an electric conductivity, a more stable compound, which mainly has a covalent bond, is used in the present invention when compared with the case in which a cathode buffer layer made of a single substance consisting of an element belonging to the I or II group in the periodic table is used. Therefore, a problem of diffusion generated when the single element is used can be prevented. Luminescence can be more sufficiently obtained even if the inorganic conductive layer is made thicker in the present invention than in the case in which the cathode buffer layer made of the insulating inorganic compound is formed. Therefore, the film thickness can easily be controlled, and a reduction in production costs and an improvement in yield can be achieved.

A first aspect of the present invention is a luminous device comprising an anode, a cathode and an organic compound layer, the device further comprising a conductive film made of an inorganic compound formed between the organic compound layer and the cathode, wherein the organic compound layer is formed to contact the anode, and the conductive film is made of a material having a smaller work function than the cathode and an electric conductivity of $1\times10^{-10}$ S/m or more.

Since an inorganic compound used for a cathode buffer layer which is formed between a cathode and an organic compound layer generally has a low electric conductivity, the luminous element cannot give luminescence sufficiently if the film thickness thereof is not set to 1 nm or less. In the present invention, however, by using the inorganic compound having an electric conductivity of $1\times10^{-10}$ s/m or more for the conductive film, the film thickness thereof can be controlled. For this reason, the formed luminous element can give sufficient luminescence.

A second aspect of the present invention is a luminous device comprising an anode, a cathode and an organic compound layer, the device further comprising a conductive film made of an inorganic compound formed between the organic compound layer and the cathode, wherein the organic compound layer is formed to contact the anode, and the conductive film is made of a material having a work function of 3.5 eV or less and an electric conductivity of $1\times10^{-10}$ S/m or more.

Since the organic compound which makes the organic compound layer has a smaller electron affinity than metals and so on, it is necessary to use an electrode having a small work function as an electrode for improving the capability of injecting electrons. For example, Mg:Ag alloy, which has been investigated as a cathode material satisfying practical properties so far, has a work function of 3.7 eV (document 3: M. A. Baldo, S. Lamansky, P. E. Burrows, M. E. Thompson, S. R. Forrest; Very high-efficiency green organic light-emitting devices based on electrophosphorescence; Applied Physics Letters, vol. 75, No. 1, 4-6 (1999)).

By forming the inorganic conductive film having a work function of 3.5 eV or less between the cathode and the organic compound layer in the present invention, an energy barrier between the cathode and the organic compound layer can be relieved even if the work function of the cathode itself is not very small. Therefore, the capability of injecting electrons from the cathode can be improved.

A third aspect of a luminous device comprising an anode, a cathode and an organic compound layer, the device further comprising a conductive film made of an inorganic compound formed between the organic compound layer and the cathode, wherein the organic compound layer is formed to contact the anode, both of the cathode and the conductive film have a thickness of 20 nm or less, and the conductive film is made of a material having a smaller work function than the cathode and an electric conductivity of $1\times10^{-10}$ S/m or more.

A fourth aspect of the present invention is a luminous device comprising an anode, a cathode and an organic compound layer, the device further comprising a conductive film made of an inorganic compound formed between the organic compound layer and the cathode, wherein the organic compound layer is formed to contact the anode, the cathode and the conductive film have a transmissivity of 70% or more, and the conductive film is made of a material having a smaller work function than the cathode and an electric conductivity of $1\times10^{-10}$ S/m or more, so as to have a thickness of 1 to 20 nm. The transmissivity means a transmissivity of visible rays being 70-100%.

A fifth aspect of the present invention is a luminous device comprising an anode, a cathode and an organic compound layer, the device further comprising a conductive film made of an inorganic compound formed between the organic compound layer and the cathode, wherein the organic compound layer is formed to contact the anode, both of the cathode and the conductive film have a thickness of 20 nm or less, and the conductive film is made of a material having a work function of 3.5 eV or less and an electric conductivity of $1\times10^{-10}$ S/m or more.

A sixth aspect of the present invention is a luminous device comprising an anode, a cathode and an organic compound layer, the device further comprising a conductive film made of an inorganic compound formed between the organic compound layer and the cathode, wherein the organic compound layer is formed to contact the anode the cathode and the conductive film have a transmissivity of 70% or more, and the conductive film is made of a material having a work function of 3.5 eV or less and an electric conductivity of $1\times10^{-10}$ S/m or more, so as to have a thickness of 1 to 20 nm.

In the above-mentioned aspects, the conductive film comprises one element or more than one element belonging to the II group in the periodic table.

In the above-mentioned aspects, the conductive film is made of one or more selected from nitrides, sulfides, borides or silicates comprising an element belonging to the II group in the periodic table.

In the above-mentioned aspects, the conductive film comprises one or more selected from calcium nitride, magnesium nitride, calcium sulfide, magnesium sulfide, strontium sulfide, barium sulfide, magnesium boride, magnesium silicate, calcium silicate, strontium silicate and barium silicate. In addition, in the above-mentioned aspects, the conductive film contains one or a plurality of materials selected from a boride containing a rare earth element. Further, in the above-mentioned aspects, the conductive film contains one or a plurality of materials selected from the group consisting of lanthanum boride, yttrium boride and cerium boride.

In the above-mentioned aspects, the inorganic conductive layer is formed mainly by vapor deposition. In the case of high melting point material such as a boride of rare earth element, it may be formed by sputtering. In the case in which sputtering is used to form the organic compound layer and subsequently form the inorganic conductive layer, it is desired to dispose a barrier layer for preventing the damage of the organic compound layer at the time of the sputtering. As the material which makes the barrier layer, specifically copper phthalocyanine (referred to as Cu-Pc hereinafter) or the like can be used.

In the case in which a cathode buffer layer made of an insulating material is conventionally formed, the film thereof cannot be made thick. However, the above-mentioned present invention makes it possible to make the film of the inorganic conductive layer thicker than that of the cathode buffer layer; therefore, the film thicknesses of respective pixels can easily be controlled. As a result, problems about production process can be solved.

The luminous device of the present invention may be an active matrix type luminous device having luminous elements connected electrically to TFTs, or a passive matrix type luminous device.

The luminescence emitted from the luminous device of the present invention may be luminescence based on either of a singlet excitation state or a triplet excitation state, or both of the two states.

BRIEF DESCRIPTION OF THE DRAWINGS

FIGS. 1A and 1B are views for explaining an element structure of a luminous device of the present invention.

FIGS. 2A to 2c are views for explaining an element structure of a luminous device of the present invention.

FIGS. 3A and 3B are views for explaining an element structure of a luminous device of the present invention.

FIGS. 5A to 5C are views for explaining a process of producing a luminous device of the present invention.

FIGS. 6A to 6C are views for explaining the process of producing the luminous device of the present invention.

FIGS. 7A and 7B are views for explaining the process of producing the luminous device of the present invention.

FIGS. 8A and 8B are views for explaining the process of producing the luminous device of the present invention.

FIGS. 9A to 9D are views for explaining an element structure of a luminous device of the present invention.

FIGS. 11A and 11B are views for explaining an element structure of a luminous device of the present invention.

DESCRIPTION OF THE PREFERRED EMBODIMENTS

Figure 4:
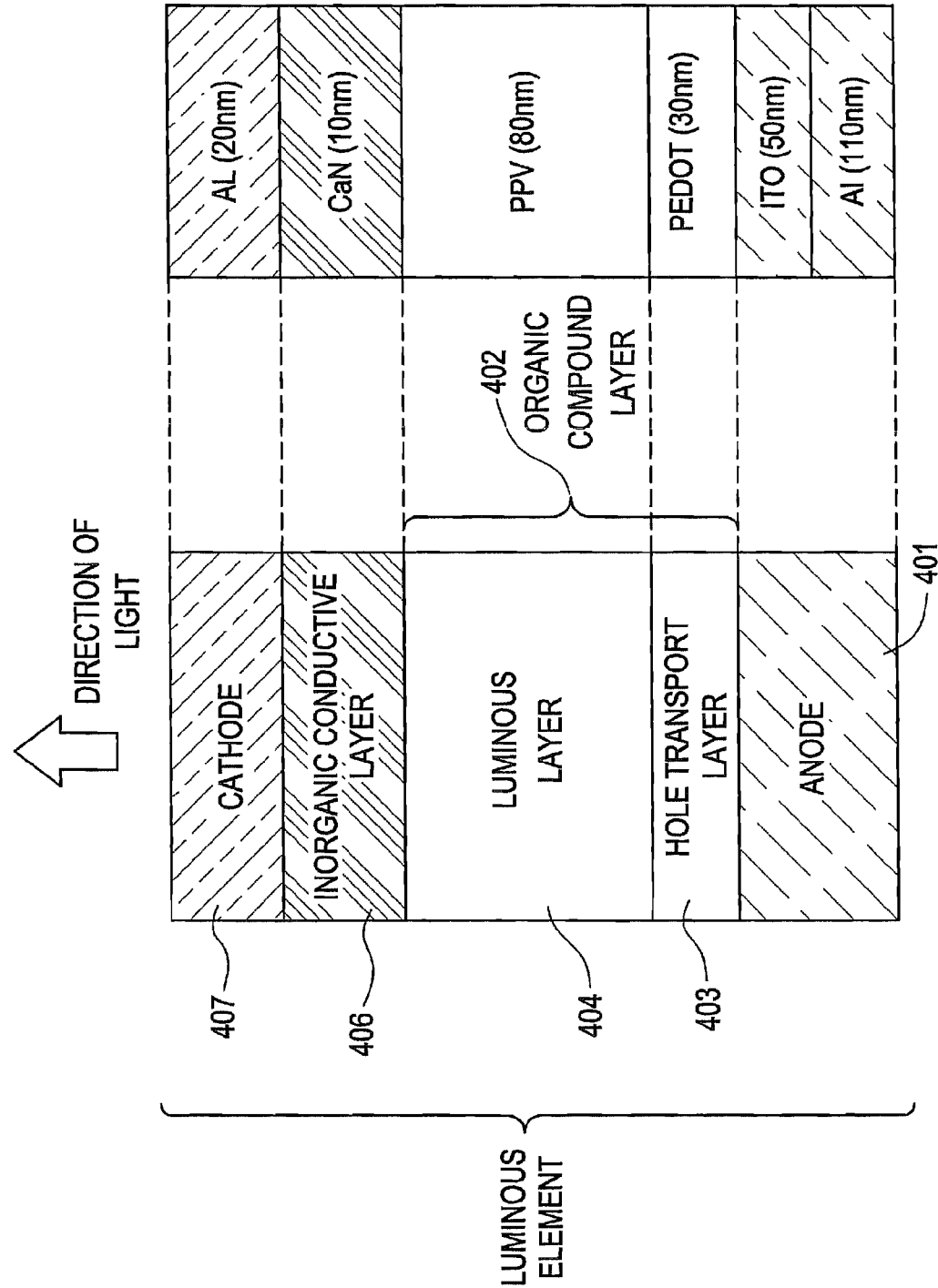
FIG. 4 is a view for explaining an element structure of a luminous device of the present invention.

Embodiments of the present invention will be described with reference to FIGS. 1 and 2. A luminous device of the present invention comprises a luminous element having an element structure illustrated in FIG. 1A.

As illustrated in FIG. 1A, a cathode 102 is formed on a substrate 101, and an inorganic conductive layer 103 is formed to contact the cathode 102.

The inorganic conductive layer 103 is made of a material having a smaller work function than the material of the cathode, and is preferably made of a material having a work function of 3.5 eV or less. The inorganic conductive layer 103 is made of a material having an electric conductivity of $1 \times 10^{-10}$ S/m or more. Since the inorganic conductive layer 103 in the present invention has electric conductivity, the film thereof can be thicker. It is however desired that the film thickness is set to about 1 to 30 nm from the viewpoint of improvement in efficiency of taking out light.

Furthermore, an organic compound layer 104 is formed to contact the inorganic conductive layer 103. The organic compound layer 104 may be formed to have a monolayer structure of only a luminous layer or may be formed by combining a luminous layer with one or more layers having different actions onto carriers, such as a hole injection layer, a hole transport layer, a hole block layer, an electron transport layer and an electron injection layer.

Next, an anode 105 is formed to contact the organic compound layer 104.

FIG. 1B shows an energy band in the luminous element having the element structure illustrated in FIG. 1A. The organic compound layer 104 formed between the cathode 102 and the anode 105 has an electron transport layer 106, a luminous layer 107, a hole transport layer 108 and a hole injection layer 109. They have a relationship about the magnitude of work functions as illustrated in FIG. 1B.

By forming the inorganic conductive layer 103 of the present invention using a material having an energy level between energy levels of the electron transport layer 106 constituting a part of the organic compound layer 104 and the cathode 102, an energy barrier 110 generated when electrons are injected from the cathode 102 can be relieved. In this way, the electron-injecting capability of the luminous element can be improved.

In FIG. 1A, the element structure wherein the cathode 102 is formed to contact the substrate 101 is illustrated. However, the present invention is not limited to this structure, and a structure wherein an anode is formed to contact the substrate 101 may be adopted. In this case, the following element structure is adopted: an element structure wherein the anode is formed to contact the substrate 101, an organic compound layer is formed to contact the anode, and an inorganic conductive layer is formed between the organic compound layer and the cathode.

The following will describe Embodiments 1 to 3 of an active matrix type luminous device having the above-mentioned element structure, referring to FIG. 2.

Embodiment 1

A sectional structure of a pixel section of a luminous device will be described as Embodiment 1 of the present invention, referring to FIG. 2A.

In FIG. 2A, semiconductor elements are formed on a substrate 201. As the substrate 201, a glass substrate having transparency is used. However, a quartz substrate may be used. As the semiconductor elements, TFTs are used. An active layer in each of the TFTs has at least a channel formed region 202, a source region 203 and a drain region 204.

The active layer in each of the TFTs is covered with a gate insulating film 205, and a gate electrode 206 overlapping the channel formed region 202 across the gate insulating film 205 is formed. An interlayer insulating film 207 covering the gate electrode 206 is deposited, and an electrode connected electrically to the source region or the drain region of each of the TFTs is formed on the interlayer insulating film 207. An electrode reaching a drain region 204 of a current-controlling TFT 222, which is an n-channel type TFT, becomes a cathode 208 of a luminous element. An insulating layer 209 having an opening to cover the edge portion of the cathode 208 and have a tapered edge is deposited. An inorganic conductive layer 210 is formed on the cathode 208. An organic compound layer 211 is deposited thereon. An anode 212 is formed on the organic compound layer 211 to form a luminous element. The luminous element is sealed up with a sealing substrate 214 in the state that a space 213 remains.

In the present embodiment, the inorganic conductive layer 210 is formed to contact the cathode 208 connected electrically to the TFT, and the organic compound layer 211 is formed to contact this layer 210.

Furthermore, the inorganic conductive layer 210 can be formed to have a film thickness of 1 to 30 nm since the inorganic conductive layer 210 has electric conductivity. Thus, it becomes easy to control the film thickness.

In the present Embodiment 1, by using a transparent conductive film for the anode 212, light generated by recombination of carriers in the organic compound layer 211 can be emitted from the side of the anode 212.

In the present Embodiment 1, the inorganic conductive layer 210 contains an element belonging to the II group in the periodic table, or contains a nitride, a sulfide, a boride or a silicate of this element. The inorganic conductive layer 210 may contain a boride of rare earth element.

Specifically, the inorganic conductive layer 210 can be made of the following material: calcium nitride, magnesium nitride, calcium sulfide, magnesium sulfide, strontium sulfide, barium sulfide, magnesium boride, magnesium silicate, calcium silicate, strontium silicate, barium silicate, or the like. Besides, the inorganic conductive layer 210 can be made of a boride containing rare earth element (Sc, Y, La, Ce, Pr, Nd, Pm, Sm, Eu, Gd, Tb, Dy, Ho, Er, Tm, Yb, Lu), preferably, lanthanum boride, yttrium boride and cerium boride. By using a stable compound mainly having a covalent bond, it is possible to prevent the diffusion of impurity ions (typically, alkali metal ions or alkali earth metal ions), which becomes a problem when a simple element of an alkali metal or an alkali earth metal is used. Thus, the capability of injecting electrons from the cathode 208 can be improved.

The material for forming the organic compound layer 211 may be a known high-molecular organic compound or a known low-molecular organic compound.

In the present Embodiment 1, the organic compound layer 211 is formed and subsequently the anode 212 made of a transparent conductive film is formed by sputtering; therefore, it is preferred to form a barrier layer (not illustrated) for preventing the damage of the organic compound layer 211 when the anode 212 is formed. By forming the hole injection layer which constitutes one part of the organic compound layer 211, the hole injection layer can have the function of a barrier layer; therefore, the hole injection layer may be formed. For the hole injection layer, copper phthalocyanine (hereinafter referred to as Cu-Pc) can be used.

Herein, the TFT of a top gate type has been described as an example. However, the type of the TFT is not particularly limited, and the present invention may be applied to a bottom gate type TFT, a forward stagger type TFT and the like type TFTs.

Embodiment 2

The following will describe a sectional structure of a pixel section of a luminous device as Embodiment 2 of the present invention, referring to FIG. 2B. The structure formed until the interlayer insulating film 207 is formed is the same as in Embodiment 1 except that the current-controlling TFT is formed to be of a p-channel type. Thus, detailed description thereof is omitted.

On the interlayer insulating film 207 is formed an electrode connected electrically to the source region or the drain region of each of the TFTs. An electrode reaching a drain region 204 of a current-controlling TFT 222, which is a p-channel type TFT, is connected electrically to an anode 231 of the luminous element. An insulating layer 232 having an opening which covers the edge portion of the anode 231 and has a tapered edge is deposited.

An organic compound layer 233 is deposited on the anode 231. An inorganic conductive layer 234 is deposited thereon. A cathode 235 is set up on the inorganic conductive layer 234 to form the luminous element. In the same manner as in Embodiment 1, the luminous element is sealed up with a sealing substrate 214 in the state that a space 213 remains.

In the present embodiment 2, the organic compound layer 233 is formed to contact the anode 231 connected electrically to the TFT. The inorganic conductive layer 234 is formed between the organic compound layer 233 and the cathode 235 to contact each of the two.

In the present Embodiment 2, by using a transparent conductive film for the anode 231, light generated by recombination of carriers in the organic compound layer 233 can be emitted from the side of the anode 231. In the present Embodiment 2, light penetrating through the anode 231 also penetrates through the substrate 201 so as to be emitted outside. For this reason, it is necessary to use a transparent material as a material used for the substrate 201. Specifically, a material such as glass, quartz or plastic is used.

In the present Embodiment 2, the organic compound layer 233 is formed and subsequently the inorganic conductive layer 234 is formed by sputtering; therefore, it is allowable to form a barrier layer (not illustrated) for preventing the damage of the organic compound layer 233 when the layer 234 is formed. For the barrier layer, Cu-Pc or the like may be used.

Embodiment 3

The following will describe a sectional structure of a pixel section of a luminous device as Embodiment 3 of the present invention, referring to FIG. 2C. The structure formed until the interlayer insulating film 207 is formed is the same as in Embodiment 1 except that the current-controlling TFT is formed to be of a p-channel type. Thus, detailed description thereof is omitted.

In the present Embodiment 3, a first electrode 241 is formed connected electrically to each TFT. A material for forming the first electrode 241 is preferably any one selected from conductive materials having light-shading property and a high reflectivity, for example, aluminum, titanium, or tungsten. It is preferred to use a monolayer made of any one selected from the above-mentioned conductive materials or a lamination wherein two or more selected from the conductive materials.

A second electrode 242 made of a material having a large work function is formed on the first electrode 241. It is desired to use a material having a small work function, such as ITO. An insulating layer 243 having an opening which covers the edge portion of the second electrode 242 and has a tapered edge is deposited. In the present embodiment 3, the lamination composed of the first electrode having light shading property and reflectivity and the second electrode having a small work function functions as an anode 244 of a single luminous element.

An organic compound layer 245 is deposited on the anode 244. An inorganic conductive layer 246 is deposited thereon. A cathode 247 is set up on the inorganic conductive layer 246 to form the luminous element. In the same manner as in Embodiment 1 and 2, the luminous element is sealed up with a sealing substrate 214 in the state that a space 213 remains.

The present embodiment 3 has the follow structure: the anode 244 is formed by stacking the first electrode 241 connected electrically to the TFT and the second electrode 242; the organic compound layer 245 is formed to contact the anode 244; and the inorganic conductive layer 246 is formed between the organic compound layer 245 and the cathode 247 to contact each of the two.

By adopting such a structure, luminescence generated by recombination of carriers in the organic compound layer 245 can be effectively emitted from the side of the cathode 247 without being emitted from the side of the anode 242.

In the present Embodiment 3, the inorganic conductive layer 246 is formed by sputtering after the formation of the organic compound layer 245. It is therefore allowable to deposit a barrier layer (not illustrated) for preventing the damage of the organic compound layer 245 when the layer 246 is formed. As the barrier layer, a material such as Cu-Pc can be used.

In order to emit luminescence generated in the organic compound layer 245 from the side of the cathode 247 in the present Embodiment 3, the film thickness of the inorganic conductive layer 246 is preferably set to 1 to 20 nm. Moreover, the cathode 247 is preferably formed to have a film thickness of 1 to 20 nm in order to penetrate light through the cathode 247.

The following will describe the present invention having the above-mentioned structure in more detail by way of Examples.

EXAMPLES

Examples of the present invention will be described.

Example 1

In the present Example, luminous devices having the element structures in Embodiments 1, 2 and 3 will be described in detail.

FIG. 3A illustrates a structure of the luminous element described in Embodiment 1. That is, this structure is a structure wherein an inorganic conductive layer 302 is formed on a cathode 301, an organic compound layer 303 is formed on the inorganic conductive layer 302, and an anode 307 is formed on the organic compound layer 303, and is an upward light-emitting type element structure wherein light generated from the organic compound layer 303 penetrates outside through the anode 307. In the case of this element structure, the ITO film, which is a transparent conductive film, is formed on the organic compound layer 303 by sputtering. Therefore, in order to prevent the damage of the organic compound layer 303 at the time of the sputtering, it is desired to set up a barrier layer 306 formed by vapor deposition.

As illustrated in FIG. 2A, the cathode 301 is an electrode connected electrically to the current-controlling TFT 222, and is made of Al to have a thickness of 120 nm in the present example.

The inorganic conductive layer 302 on the cathode 301 is made by vapor deposition using CaN, to have a thickness of 30 nm.

In the present example, the organic compound layer 303 formed on the inorganic conductive layer 302 has a lamination structure of a luminous layer 304 and a hole transport layer 305. The organic compound layer 303 in the present example will be described about a case in which the layer 303 is made of a high-molecular organic compound. However, the layer 303 may be made of a monolayer or a multilayer of a low-molecular compound.

The luminous layer 304 can be made of a material of poly p-phenylene vinylene, poly p-phenylene, polythiophene, or polyfluorene type.

As the poly p-phenylene vinylene type material, the following can be used: poly(p-phenylene vinylene), referred to as PPV hereinafter, or poly[2-(2'-ethylhexoxy)-5-methoxy-1,4-phenylene vinylene], referred to as MEH-PPV hereinafter, each of which can give orange luminescence; poly[2-(dialkoxyphenyl)-1,4-phenylene vinylene], referred to as ROPh-PPV, which can give green luminescence; or the like.

As the polyparaphenylene type material, the following can be used: poly(2,5-dialkoxy-1,4-phenylene), referred to as RO-PPP hereinafter, poly(2,5-dihexoxy-1,4-phenylene), each of which can give blue luminescence; or the like.

As the polythiophene type material, the following can be used: poly(3-alkylthiophene), referred to as PAT hereinafter, poly(3-hexylthiophene), referred to as PHT hereinafter, poly(3-cyclohexylthiophene), referred to as PCHT hereinafter, poly(3-cyclohexyl-4-methylthiophene), referred to as PCHMT hereinafter, poly(3,4-dicyclohexylthiophene), referred to as PDCHT hereinafter, poly[3-(4-octylphenyl)-thiophene], referred to as POPT hereinafter, or poly[3-(4-octylphenyl)-2,2-bithiophene], referred to as PTOPT hereinafter, each of which can give red luminescence; or the like.

As the polyfluorene type material, the following can be used: poly(9,9-dialkylfluorene), referred to as PDAF hereinafter, or poly(9,9-dioctylfluorene), referred to as PDOF hereinafter, each of which can give blue luminescence; or the like.

The above-mentioned material which can form a luminous layer is dissolved in an organic solvent, and then the solution is applied by any coating method. Examples of the organic solvent used herein include toluene, benzene, chlorobenzene, dichlorobenzene, chloroform, tetralin, xylene, dichloromethane, cyclohexane, NMP (N-methyl-2-pyrrolidone), dimethylsulfoxide, cyclohexanone, dioxane, and THF (tetrahydrofuran).

The hole transport layer 305 can be formed using both of poly(3,4-ethylene dioxythiophene), referred to as PEDOT hereinafter, and polystyrene sulfonic acid, referred to as PSS hereinafter, which is an acceptor material, or both of polyaniline, referred to as PANI hereinafter, and a camphor sulfonic acid, referred to as CSA hereinafter. The material is made into an aqueous solution since the material is water-soluble, and then the aqueous solution is applied by any coating method so as to form a film.

In the present example, a film made of PPV is formed as the luminous layer 304 to have a thickness of 80 nm, and a film composed of PEDOT and PSS is formed as the hole transport layer 305 to have a thickness of 30 nm.

A barrier layer 306 is formed on the organic compound layer 303. As the material which makes the barrier layer 306, there can be used a material having a large work function, such as gold or silver, Cu-Pc or the like. In the present example, Au is used to form the barrier layer 303 of 20 nm thickness by vapor deposition.

Next, an anode 307 is formed. As the material which makes the anode 307, a transparent material such as ITO (indium tin oxide) or IZO (indium zinc oxide) is used. In the present example, ITO is used to form the anode 397 of 110 nm thickness by sputtering.

As described above, an upward light-emitting type luminous element described in Embodiment 1 can be obtained.

The structure of the luminous element described in Embodiment 2 is illustrated in FIG. 3B. That is, this structure is a structure wherein an organic compound layer 312 is formed on an anode 311, an inorganic conductive layer 316 is formed on the organic compound layer 312 and a cathode 317 is formed thereon, and is a downward light-emitting element structure, wherein light generated in the organic compound layer 312 penetrates outside through the anode 311.

As illustrated in FIG. 2B, the anode 311 is a transparent electrode connected electrically to the current-controlling TFT 222, and is made of ITO to have a thickness of 110 nm in the present example.

The organic compound layer 312 formed on the anode 311 has a lamination structure of a hole transport layer 313 and a luminous layer 314 as illustrated in FIG. 3A. As the materials which make the hole transport layer 313 and the luminous layer 314, the same materials as described above can be used. In the same manner as illustrated in FIG. 3A, the hole transport layer 313 composed of PEDOT and PSS is formed to have a thickness of 30 nm, and the luminous layer 314 made of PPV is formed to have a thickness of 80 nm.

The inorganic conductive layer 316 on the organic compound 312 is formed by vapor deposition using CaN, to have a thickness of 30 nm in the same way as illustrated in FIG. 3A.

A cathode 317 is formed on the inorganic conductive layer 316. The cathode 317 is formed using Al as the material of the cathode herein, to have a thickness of 120 nm.

As described above, a downward light-emitting type luminous element described in Embodiment 2 can be obtained.

The structure of the luminous element described in Embodiment 3 is illustrated in FIG. 4. That is, this structure is a structure wherein an organic compound layer 402 is formed on an anode 401, an inorganic conductive layer 406 is formed on the organic compound layer 402, and a cathode 407 is formed thereon, and is an upward light-emitting element structure, wherein light generated in the organic compound layer 402 penetrates outside through the inorganic conductive layer 406 and the cathode 407.

As illustrated in FIG. 2C, the anode 401 is made of a lamination of a first electrode 241 and a second electrode 242 connected electrically to the current-controlling TFT 222. In the present example, the anode 401 is made of a lamination of Al which makes the first electrode 241 having a thickness of 100 nm and ITO which makes the second electrode 242 having a thickness of 50 nm.

The organic compound 402 formed on the anode 401 is made of a lamination of a hole transport layer 403 and a luminous layer 404 in the same manner as illustrated in FIG. 3A. The materials which make the hole transport layer 403 and the luminous layer 404 can be selected from the above-mentioned materials, and used. In the same manner as illustrated in FIG. 3A, the hole transport layer 403 composed of PEDOT and PSS is formed to have a thickness of 30 nm, and the luminous layer 404 made of PPV is formed to have a thickness of 80 nm.

In the same manner as illustrated in FIG. 3A, the inorganic conductive layer 406 formed on the organic compound layer 402 is formed by vapor deposition using CaN. The inorganic conductive layer 406 is formed herein to have a thickness of 10 nm in such a manner that light generated in the organic compound layer 402 can penetrate through the inorganic conductive layer 406.

A cathode 407 is formed on the inorganic conductive layer 406. Al is used herein as the material of the cathode to form the cathode 407 to have a thickness of 20 nm, considering light transmissivity.

As described above, an upward light-emitting luminous element described in Embodiment 3 can be obtained.

Example 2

In forming a element substrate, a method of simultaneously forming, on the same substrate, a pixel portion and TFTs (n-channel TFT and p-channel TFT) of a driver circuit formed in the periphery of the pixel portion and forming a luminescent element which connect to the TFT at pixel portion is described in detail using FIGS. 5 to 8 in this example. Note that, in this example, luminescent element having the structure described in example 1 is formed.

First, in this example, a substrate 600 is used, which is made from glass, such as barium borosilicate glass or aluminum borosilicate, represented by such as Corning #7059 glass and #1737. Note that, as the substrate 600, a quartz substrate on which an insulating film is formed, may be used as the replace. A plastic substrate having heat resistance to a process temperature of this example may also be used.

Then, a base film 601 formed from an insulating film such as a silicon oxide film, a silicon nitride film or a silicon oxynitride film. In this example, a two-layer structure is used as the base film 601. However, a single-layer film or a lamination structure consisting of two or more layers of the insulating film may be used. As a first layer of the base film 601, a silicon oxynitride film 601$a$ is formed into a thickness of 10 to 200 nm (preferably 50 to 100 nm) using $SiH_4$, $NH_3$, and $N_2O$ as reaction gases by plasma CVD. In this example, the silicon oxynitride film 601$a$ (composition ratio Si=32%, O=27%, N=24% and H=17%) having a film thickness of 50 nm is formed.

Then, as a second layer of the base film 601, a silicon oxynitride film 601$b$ is formed so as to laminate thereon into a thickness of 50 to 200 nm (preferably 100 to 150 nm) using $SiH_4$ and $N_2O$ as reaction gases by plasma CVD. In this example, the silicon oxynitride film 601$b$ (composition ratio Si=32%, O=59%, N=7% and H=2%) having a film thickness of 100 nm is formed.

Subsequently, semiconductor layers 602 to 605 are formed on the base film 601. The semiconductor layers 602 to 605 are formed from a semiconductor film having an amorphous structure by a known method (a sputtering method, an LPCVD method, or a plasma CVD method), and is subjected to a known crystallization process (a laser crystallization method, a thermal crystallization method, or a thermal crystallization method using a catalyst such as nickel). The crystalline semiconductor film thus obtained is patterned into desired shapes to obtain the semiconductor layers. The semiconductor layers 602 to 605 are formed into the thickness of from 25 to 80 nm (preferably 30 to 60 nm). The material of the crystalline semiconductor film is not particularly limited, but it is preferable to form the film using silicon, a silicon germanium ($Si_{1-x}Ge_x$ (x=0.01 to 0.02)) alloy, or the like.

In this example, 55 nm thick amorphous silicon film is formed by plasma CVD, and then, nickel-containing solution is held on the amorphous silicon film. A dehydrogenating process of the amorphous silicon film is performed (500° C. for one hour), and thereafter a thermal crystallization process is performed (550° C. for four hours) thereto. Further, to improve the crystallinity thereof, laser anneal treatment is performed to form the crystalline silicon film. Then, this crystalline silicon film is subjected to a patterning process using a photolithography method, to obtain the semiconductor layers 602 to 605.

Further, before or after the formation of the semiconductor layers 602 to 605, a minute amount of impurity element (boron or phosphorus) may be doped to control a threshold value of the TFT.

Besides, in the case where the crystalline semiconductor film is manufactured by the laser crystal method, a pulse oscillation type or continuous-wave type gas state laser or solid state laser. As the gas sate laser, excimer laser, Ar laser, or Kr laser may be used. As the solid state laser, YAG laser, $YVO_4$ laser, YLF laser, $YalO_3$ laser, glass laser, ruby laser, Ti: sapphire laser may be used.

In the case where those lasers are used, it is appropriate to use a method in which laser light radiated from a laser oscillator is condensed by an optical system into a linear beam, and is irradiated to the semiconductor film. Although the conditions of the crystallization should be properly selected by an operator, in the case where the exciter laser is used, a pulse oscillation frequency is set as 300 Hz, and a laser energy density is as 100 to 400 $mJ/cm^2$ (typically 200 to 300 $mJ/cm^2$). In the case where the YAG laser is used, it is appropriate that the second harmonic is used to set a pulse oscillation frequency as 30 to 300 kHz, and a laser energy density is set as 300 to 600 $mJ/cm^2$ (typically, 350 to 500 $mJ/cm^2$). Then, laser light condensed into a linear shape with a width of 100 to 1000 μm, for example, 400 μm is irradiated to the whole surface of the substrate, and an overlapping ratio (overlap ratio) of the linear laser light at this time may be set as 50 to 90%.

A gate insulating film 607 is then formed for covering the semiconductor layers 602 to 605. The gate insulating film 607 is formed from an insulating film containing silicon by plasma CVD or sputtering into a film thickness of from 40 to 150 nm. In the example, the gate insulating film 306 is formed from a silicon oxynitride film into a thickness of 110 nm by plasma CVD (composition ratio Si=32%, O=59%, N=7%, and H=2%). Of course, the gate insulating film 607 is not limited to the silicon oxynitride film, an insulating film containing other silicon may be formed into a single layer of a lamination structure.

Beside, when the silicon oxide film is used, it can be formed by plasma CVD in which TEOS (tetraethyl orthosilicate) and $O_2$ are mixed, with a reaction pressure of 40 Pa, a substrate temperature of from 300 to 400° C., and discharged at a high frequency (13.56 MHZ) power density of 0.5 to 0.8 $W/cm^2$. Good characteristics as the gate insulating film can be obtained in the silicon oxide film thus manufactured by subsequent thermal annealing at 400 to 500° C.

Then, as shown in FIG. 5A, on the gate insulating film 607, a first conductive film 608 and a second conductive film 609 are formed into lamination to have a film thickness of 20 to 100 nm and 100 to 400 nm, respectively. In this example, the first conductive film 608 made from a TaN film with a film thickness of 30 nm and the second conductive film 609 made from a W film with a film thickness of 370 nm are formed into lamination. The TaN film is formed by sputtering with a Ta target under an atmosphere containing nitrogen. Besides, the W film is formed by the sputtering method with a W target. The W film may be formed by thermal CVD using tungsten hexafluoride ($WF_6$).

Whichever method is used, it is necessary to make the material have low resistance for use as the gate electrode, and it is preferred that the resistivity of the W film is set to less than or equal to 20 μΩcm. By making the crystal grains large, it is possible to make the W film have lower resistivity. However, in the case where many impurity elements such as oxygen are contained within the W film, crystallization is inhibited and the resistance becomes higher. Therefore, in this example, by forming the W film having high purity by sputtering using a target having a purity of 99.9999%, and in addition, by taking sufficient consideration to prevent impurities within the gas phase from mixing therein during the film formation, a resistivity of from 9 to 20 μΩcm can be realized.

Note that, in this example, the first conductive film 608 is made of TaN, and the second conductive film 609 is made of W, but the material is not particularly limited thereto, and either film may be formed of an element selected from Ta, W, Ti, Mo, Al, Cu, Cr and Nd or an alloy material or a compound material containing the above element as its main ingredient. Besides, a semiconductor film typified by a polycrystalline silicon film doped with an impurity element such as phosphorus may be used. Also, an alloy containing Ag, Pd, Cu can be used.

Besides, any combination may be employed such as a combination in which the first conductive film 608 is formed of tantalum (Ta) and the second conductive film 609 is formed of W, a combination in which the first conductive film 608 is formed of titanium nitride (TiN) and the second conductive film 609 is formed of W, a combination in which the first conductive film 608 is formed of tantalum nitride (TaN) and the second conductive film 609 is formed of Al, or a combination in which the first conductive film 608 is formed of tantalum nitride (TaN) and the second conductive film 609 is formed of Cu, or a combination in which the first conductive film 608 is formed of W, Mo, or the combination of W and Mo and the second conductive film 609 is formed of Al and Si or Al and Ti or Al and Sc or Al and Nd, further, the third conductive film (not shown) is formed from Ti, TiN or the combination of Ti and TiN.

Next, masks 610 to 613 made of resist are formed using a photolithography method, and a first etching process is performed in order to form electrodes and wirings as shown in FIG. 5B. This first etching process is performed with the first and second etching conditions. In This example, as the first etching conditions, an ICP (inductively coupled plasma) etching method is used, a gas mixture of $CF_4$, $Cl_2$ and $O_9$ is used as an etching gas, the gas flow rate is set to 25/25/10 sccm, and plasma is generated by applying a 500 W RF (13.56 MHZ) power to a coil shape electrode under 1 Pa. A dry etching device with ICP (Model E645-ICP) produced by Matsushita Electric Industrial Co. Ltd. is used here. A 150 W RF (13.56 MHZ) power is also applied to the substrate side (test piece stage) to effectively apply a negative self-bias voltage.

The W film is etched with the first etching conditions, and the end portion of the second conductive layer is formed into a tapered shape. In the first etching conditions, the etching rate for W is 200.39 nm/min, the etching rate for TaN is 80.32 nm/min, and the selectivity of W to TaN is about 2.5. Further, the taper angle of W is about 26° with the first etching conditions.

Thereafter, as shown in FIG. 5B, the first etching conditions are changed into the second etching conditions without removing the masks 610 to 613 made of resist, a mixed gas of $CF_4$ and $Cl_2$ is used as an etching gas, the gas flow rate is set to 30/30 sccm, and plasma is generated by applying a 500 W RF (13.56 MHZ) power to a coil shape electrode under 1 Pa to thereby perform etching for about 15 seconds. A 20 W RF (13.56 MHZ) power is also applied to the substrate side (test piece stage) to effectively a negative self-bias voltage. The W film and the TaN film are both etched on the same order with the second etching conditions in which $CF_4$ and $Cl_2$ are mixed.

In the second etching conditions, the etching rate for W is 58.97 nm/min, and the etching rate for TaN is 66.43 nm/min. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 615 to 618 (first conductive layers 615a to 618a and second conductive layers 615b to 618b) constituted of the first conductive layers and the second conductive layers are formed by the first etching process. Reference numeral 620 denotes a gate insulating film, and regions of the gate insulating film which are not covered by the first shape conductive layers 615 to 618 are made thinner by approximately 20 to 50 nm by etching.

Figure 15A:
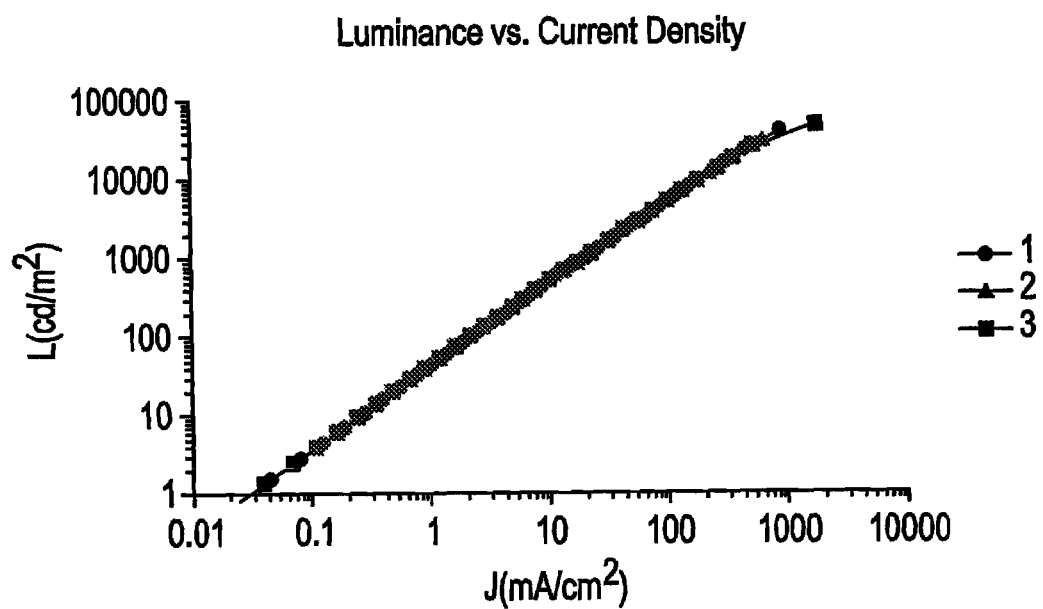
FIGS. 15A and 15B are graphs showing results obtained by measuring the element characteristics of a conventional luminous element.
Figure 15B:
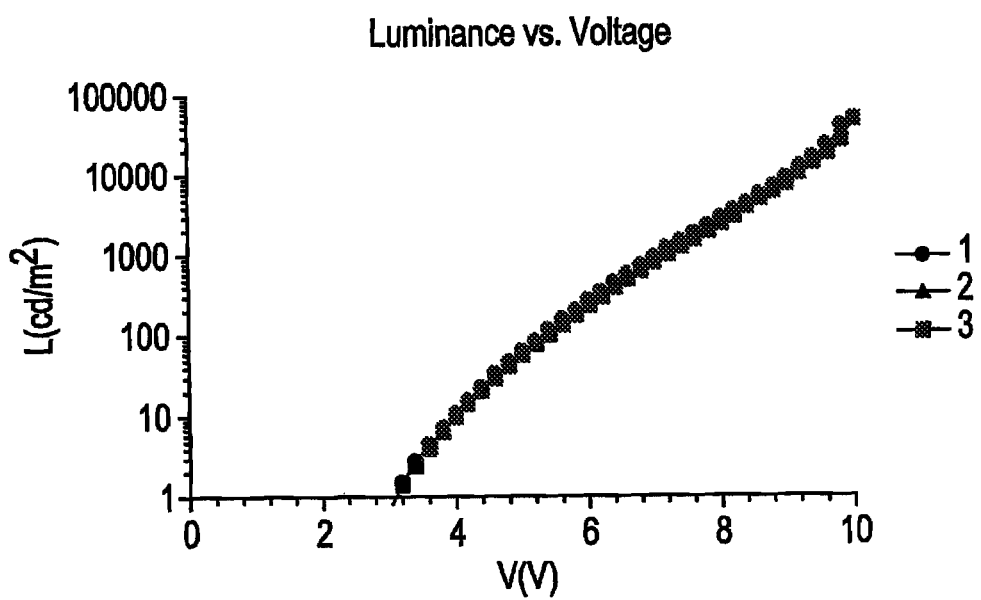

Then, a first doping process is performed to add an impurity element for imparting an n-type conductivity to the semiconductor layer without removing the mask made of resist (FIG. 15B). Doping may be carried out by an ion doping method or an ion injecting method. The condition of the ion doping method is that a dosage is $1\times10^{13}$ to $5\times10^{15}$ atoms/$cm^2$, and an acceleration voltage is 60 to 100 keV. In this example, the dosage is $1.5\times10^{15}$ atoms/$cm^2$ and the acceleration voltage is 80 keV.

As the impurity element for imparting the n-type conductivity, an element which belongs to group 15 of the periodic table, typically phosphorus (P) or arsenic (As) is used, and phosphorus is used here. In this case, the conductive layers 615 to 618 become masks to the impurity element for imparting the n-type conductivity, and high concentration impurity regions 621 to 624 are formed in a self-aligning manner. The impurity element for imparting the n-type conductivity is added to the high concentration impurity regions 621 to 624 in the concentration range of $1\times10^{20}$ to $1\times10^{21}$ atoms/$cm^3$.

Thereafter, the second etching process is performed without removing the masks made of resist as shown in FIG. 15C. The second etching process is performed by third or fourth etching condition. Here, a mixed gas of $CF_4$, $Cl_2$ is used as an etching gas, the gas flow rate is set to 30/30 sccm, and plasma is generated by applying a 500 W RF (13.56 MHZ) power to a coil shape electrode under 1 Pa to thereby perform etching for about 60 seconds. A 20 W RF (13.56 MHZ) power is also applied to the substrate side (test piece stage) to effectively apply a negative self-bias voltage. The W film and the TaN film are both etched on the same order with the third etching conditions in which $CF_4$ and $Cl_2$ are mixed.

In the second etching process, the etching rate for W is 58.97 nm/min, the etching rate for TaN is 66.43. Note that, the etching time may be increased by approximately 10 to 20% in order to perform etching without any residue on the gate insulating film.

Thereafter, as shown in FIG. 5C, the third etching conditions are changed into the fourth etching conditions. Without removing the masks 610-613 made of resist, a mixed gas of $CF_4$, $Cl_2$ and $O_2$ is used as an etching gas, the gas flow rate is set to 20/20/20 sccm, and plasma is generated by applying a 500 W RF (13.56 MHZ) power to a coil shape electrode under 1 Pa to thereby perform etching for about 20 seconds. A 20 W RF (13.56 MHZ) power is also applied to the substrate side (test piece stage) to effectively apply a negative self-bias voltage.

In the fourth etching conditions, etching rate for TaN is 14.83 nm/min. Therefore, the W film etched selectively. According to the fourth etching process, the second conductive layer 626-629 (first conductive layer 626a-629a and second conductive layer 626b-629b) are formed.

Next, a second doping process is performed as shown in FIG. 6A. First conductive layers 626a to 629a and second conductive layers 626b to 629b are used as masks to an impurity element, and doping is performed such that the impurity element is added to the semiconductor layer below the tapered portions of the first conductive layers. In this example, phosphorus (P) is used as the impurity element, and plasma doping is performed with the dosage of $1.5\times10^{14}$ atoms/$cm^2$, current density of 0.5 A and the acceleration voltage of 90 keV.

Thus, low concentration impurity regions 631a to 634a, which overlap with the first conductive layers and low concentration impurity regions 631b to 634b, which do not overlap with the first conductive layers are formed in a self-aligning manner. The concentration of phosphorus (P) in the low concentration impurity regions 631 to 634 is $1\times10^{17}$ to $5\times10^{18}$ atoms/$cm^3$. Further, the impurity element is added to the high concentration impurity regions 621-624 and the high concentration impurity regions 635-638 are formed.

New masks 639 and 640 are formed from resist, and a third doping process is performed. Impurity regions 641 to 642, to which an impurity element is added that imparts the opposite conductivity type (p-type) from the single conductivity type (n-type) are formed to the semiconductor layers, which become active layers of p-channel TFTs, by the third doping process. (See FIG. 6B.) The first conductive layers 627a and the second conductive layer 627b are used as masks against the impurity element, the impurity element imparting p-type conductivity is added, and the impurity regions are formed in a self-aligning manner.

The impurity regions 641 to 642 are formed in Example 2 by ion doping using diborane ($B_2H_6$). Phosphorous is added to the impurity regions 641 to 642 in differing concentrations, respectively, by the first doping process and by the second doping process. However, doping is performed such that the concentration of the impurity element which imparts p-type conductivity to each of the regions becomes from $2\times10^{20}$ to $2\times10^{21}$ atoms/$cm^3$, and therefore no problems will develop with the regions functioning as source regions and drain regions of p-channel TFTs.

The resist masks 639 and 640 are removed next, and a first interlayer insulating film 643 is formed. In this example, as the first inter layer insulating film 643, the lamination film is formed from the first insulating film 643a containing silicon and nitride and the second insulating film 643b containing silicon and oxygen.

An insluting film containing silicon is formed having a thickness of 100 to 200 nm, using plasma CVD or sputtering, as the first interlayer insulating film 643a. A silicon oxynitride film is formed with a film thickness of 100 nm by plasma CVD in Example 2. The first interlayer insulating film 643a is of course not limited to the silicon oxynitride film, and other insulating films containing silicon may be used in a single layer or a lamination structure.

Next, a process for activating the impurity elements added to each of the semiconductor layers is performed. Thermal annealing using an annealing furnace is performed for the activation process. Thermal annealing may be performed in a nitrogen atmosphere having an oxygen concentration of 1 ppm or less, preferably 0.1 ppm or less, at 400 to 700° C., typically between 500 and 550° C. The activation process is performed in Example 2 by heat treatment at 550° C. for four hours. Note that, in addition to thermal annealing, laser annealing and rapid thermal annealing (RTA) can also be applied.

Note also that, in Example 2, nickel used as a catalyst during crystallization is gettered into the impurity regions 635, 636, 637, and 638 containing phosphorous at a high concentration at the same time as the above activation process is performed. The nickel concentration within the semiconductor layers that mainly become channel forming regions is thus reduced. The value of the off current is reduced for TFTs having channel forming regions thus formed, and a high electric field effect mobility is obtained because of the good crystallinity. Thus, good properties can be achieved.

Further, the activation process may also be performed before forming the first interlayer insulating film. However, when using a wiring material which is weak with respect to heat, it is preferable to perform the activation process after forming the interlayer insulating film (insulating film containing silicon as its main constituent, silicon nitride film, for example) in order to protect the wirings and the like, as in Example 2.

The doping process may be performed, and the first interlayer insulating film may be formed after performing the activation process.

In addition, heat treatment is performed for 1 to 12 hours at 300 to 550° C. in an atmosphere containing hydrogen of 3 to 100%, performing hydrogenation of the semiconductor layers. Heat treatment is performed for one hour at 410° C. in a atmosphere containing approximately 3% hydrogen in Example 2. This process is one for terminating dangling bonds of the semiconductor layers by hydrogen contained in the interlayer insulating film. Plasma hydrogenation (using hydrogen excited by plasma) may be performed as another means of hydrogenation.

Further, when using a laser annealing method as the activation process, it is preferable to irradiate laser light such as that from an excimer laser or a YAG laser after performing the above hydrogenation process.

A second interlayer insulating film 643b is formed next on the first interlayer insulating film 643a from insulating film containing silicon with a thickness of 1-2 μm by plasma CVD or sputtering. A silicon oxide film having a film thickness of 1.2 μm is formed in Example 2. Of course, the second insulating film 643b is not limited to the above mentioned film, an insulating film containing other silicon may be formed into a single layer or a lamination structure.

Then the first interlayer insulating film 643 made from first insulating film 643a and second insulating film 643b can be formed.

Next, patterning is performed in order to form contact holes for reaching the impurity regions 635, 636, 637, and 638.

In addition, the first insulating film 643a and the second insulating film 643b are insulating film contained silicon formed plasma CVD, so that dry etching method or wet etching method can be used for forming a contact hole. However, in this embodiment, wet etching method is used for etching the first insulating film, and the dry etching method is used for etching the second insulating film.

First, the second insulating film 643b is etched. Here, a mixed solution (Stella chemifa Inc., brand name LAL 500) contained 7.14% of hydrogen ammonium fluoride ($NH_4HF_2$) and 15.4% of ammonium fluoride ($NH_4F$) is used as a etchant to conduct a wet etching at 20° C.

Next, the first insulating film 643a is etched. $CHF_4$ is used as an etching gas, and gas flow rates are set to 35 sccm. An 800 W RF electric power is applied at a pressure of 1 Pa, and dry etching is performed.

Wirings 645 to 651 and cathode 652 are formed that connect electrically with high concentration impurity regions 635, 636, 637, and 638 respectively. In this embodiment, these wirings are formed by patterning Al film in 500 nm thicknesses. Besides, a single layer constituted Ti, TiN, Al: Si and the like, or a lamination layer laminated Ti, TiN, Al: Si, and Ti in turn can also be used.

In this embodiment, the cathode 652 is formed simultaneously with wiring formation, and to serve a function as a wiring of high concentration impurity region 638.

The insulating film is formed in 1 μm thickness. As material forming an insulating film, a film containing silicon oxide is used in this embodiment. Another films such as insulating film containing silicon nitride, or silicon oxide nitride, the organic resin film, polyimide, polyamide, acrylic (photosensitive acrylic is included), BCB (benzocyclobutene), or the like may also be used.

An opening portion is formed to correspond to the cathode 652 of this insulating film, and the insulating film 653 is formed (FIG. 7B).

Specifically, the insulating film 653 is formed by that the insulating film is formed in 1 μm thick using a photosensitive acrylic, and after that it is patterned using photolithography method and is performed etching treatment.

On the exposed cathode 652 at the opening portion in the insulating film 653, inorganic conductive layer 654 is formed by evaporation method. In this embodiment, as materials for forming the inorganic conductive layer 654, a conductive nitride, a carbide, an oxide, a boride, and a silicide that are composed of elements of second group of the periodic system can be used. However, inorganic conductive layer 654 is formed by using nitride calcium (CaN).

In this embodiment, the inorganic conductive layer 654 is formed by using a vacuum evaporation method maintaining a thickness of from 1 to 50 nm (preferably, from 10 to 20 nm). In this embodiment, the inorganic conductive layer 654 is formed maintaining a thickness of 30 nm.

Figure 8A:
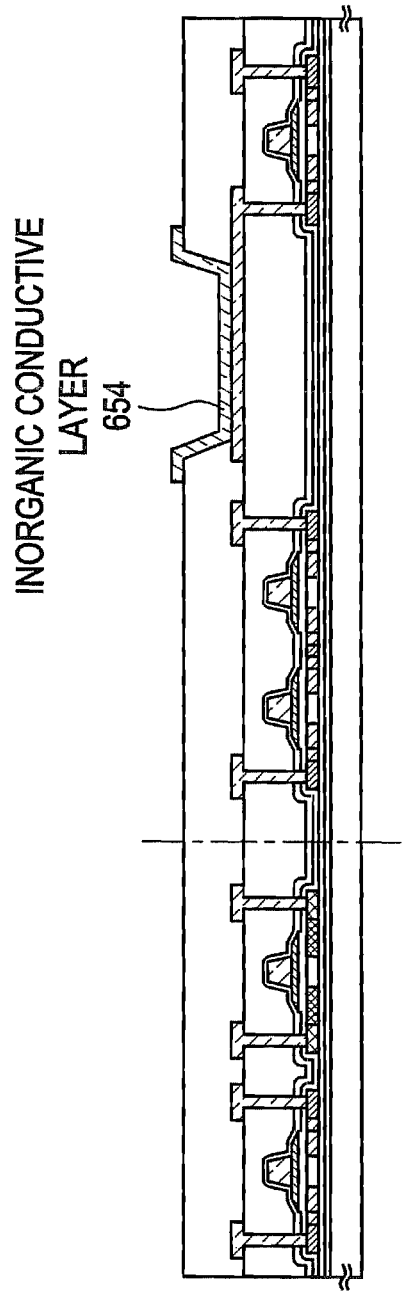

As shown in FIG. 8, an organic compound layer 655 is formed on the inorganic conductive layer 654 by an evaporation method. In this embodiment, the state of forming one kind of organic compound layer from organic compound layers that are constituted organic compounds emitting three kinds of luminescence, red, green, and blue is illustrated. The combination of the organic compounds that form three kinds of organic compounds layer is described with reference to FIG. 9.

Figure 9C:
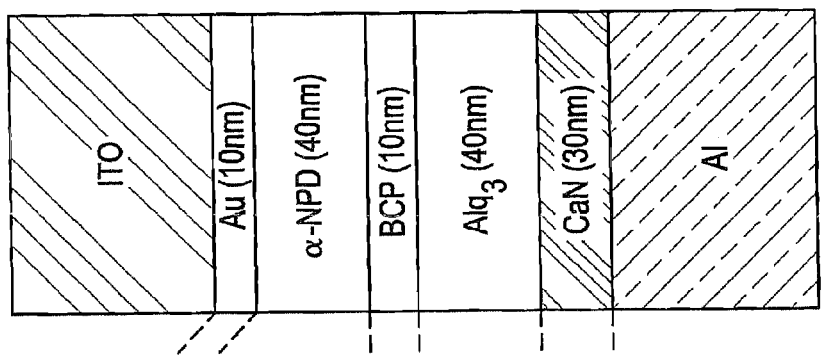
Figure 9D:
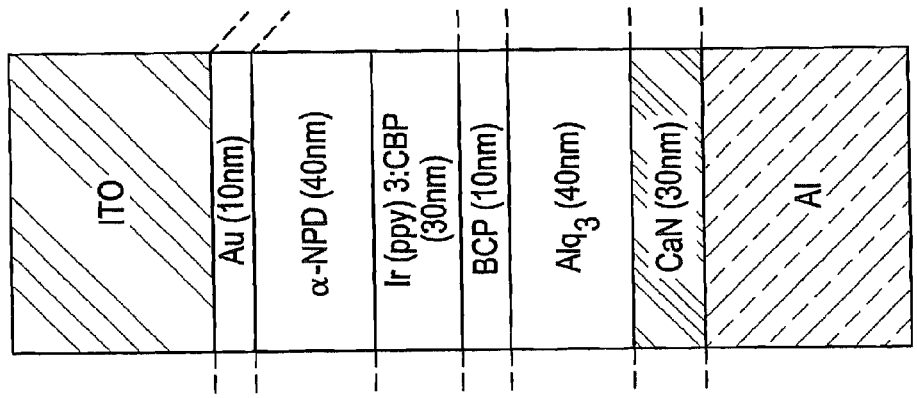

A light emitting element shown in FIG. 9A is constituted a cathode 901, an inorganic conductive layer 902, an organic compound layer 903, a barrier layer 908, and an anode 909. The organic compound layer 903 has a lamination structure constituted an electron transporting layer 904, a blocking layer 905, a light emitting layer 906, and a positive hole transporting layer 907. As for the material that constitute red luminescent light emitting element and the thickness are illustrated in FIG. 9B, as for the material that constitute green luminescent light emitting element and the thickness are illustrated in FIG. 9C, and as for the material that constitute blue luminescent light emitting element and the thickness are illustrated in FIG. 9D respectively.

First, an organic compound layer emitting red light is formed. Specifically, a tris (8-quinolinolato) aluminum (hereinafter referred to as the $Alq_3$) as an electron transporting organic compound is formed into an electron transporting layer 904 in a 40 nm film thickness. A basocuproin (hereinafter referred to as the BCP) as a blocking organic compound is formed into a blocking layer 905 in a 10 nm film thickness. A 2,3,7,8,12,13,17,18-octaethyl-21H,23H-porphyrin-platinum (hereinafter referred to as the PtOEP) as a luminescent organic compound is co-deposited to form the light emitting layer 906 with organic compounds (hereinafter referred to as the host materials) a 4,4'-dicarbazol-biphenyl (hereinafter referred to as the CBP) to serve as the host in a 30 nm film thickness. A 4,4'-bis[N-(1-naphthyl)-N-phenyl-amino]-biphenyl (hereinafter referred to as the α-NPD) as a positive hole transporting organic compound is formed into a hole transporting layer 907 in a 40 nm film thickness. Thereby, a red luminescent organic compound layer can be formed.

Although the case of forming a red luminescent organic compound layer using 5 kinds of organic compounds with different functions is explained here, the present invention is not limited thereto, and known materials can be used as the organic compound showing the red luminescence.

A green luminescent organic compound layer is formed. Specifically, an $Alq_3$ as an electron transporting organic compound is formed into the electron transporting layer 904 in a 40 nm film thickness. A BCP as a blocking organic compound is formed into the blocking layer 905 in a 10 nm film thickness. The light emitting layer 906 is formed by that a CBP used as a positive hole transmitting host material is co-deposited with a tris (2-phenyl pyridine) iridium ($Ir(ppy)_3$) in a 30 nm film thickness. An α-NPD as a positive hole transporting organic compound is formed into the positive hole transporting layer 907 in a 40 nm film thickness. Thereby, a green luminescent organic compound layer can be formed.

Although the case of forming a green luminescent organic compound layer using 4 kinds of organic compounds with different functions is explained here, the present invention is not limited thereto, and known materials can be used as the organic compound showing the green luminescence.

A blue luminescent organic compound layer is formed. Specifically, an $Alq_3$ as an electron transporting organic compound is formed into the electron transporting layer 904 in a 40 nm film thickness. A BCP as a blocking organic compound is formed into the blocking layer 905 in a 10 nm film thickness. An α-NPD as a luminescent organic compound and a positive hole transporting organic compound is formed into the light emitting layer 906 in a 40 nm film thickness. Thereby, a blue luminescent organic compound layer can be formed.

Although the case of forming a blue luminescent organic compound layer using 3 kinds of organic compounds with different functions is explained here, the present invention is not limited thereto, and known materials can be used as the organic compound showing the blue light emission.

By forming the above-mentioned organic compounds on the cathode, an organic compound layer emitting the red luminescence, the green luminescence and the blue luminescence can be formed in the pixel portion.

In the light emitting structure in this embodiment, the anode 909 made out of transparent conductive film is formed by sputtering after the organic compound layer 903 is formed. According to this, the surface of the organic compound layer 903 is damaged when the anode 909 is formed. In this embodiment, a barrier layer 903 is provided on the organic compound layer 903 in order to prevent the organic compound layer 903 from being damaged.

As a material forming the barrier layer 908, materials with large work function such as gold and silver, and Cu-Pc having a positive injection can be used. In this embodiment, the barrier film 908 is formed by forming gold maintaining a thickness of 10 nm. (FIG. 9A)

Next, an anode 656 made from transparent conductive film is formed covering an organic compound layer 655 and an insulating layer 653 as shown in FIG. 8B. In this embodiment, as a material of forming the anode 656, an indium-tin oxide (ITO) film or a transparent conductive film formed maintaining a thickness of 80 to 120 nm having 2 to 20[%] of a zinc oxide (ZnO) added to an indium oxide is used. When a transparent conductive film have a large work function, another known materials can be used to form the anode 656.

As shown in FIG. 8B, an element substrate having a light emitting element 657 that is composed of the cathode 652 connected to the current control TFT 704 electrically, the insulating layer 653 formed between the cathode 652 and the first electrode (not illustrated) included in next pixel, the inorganic conductive layer 654 formed on the cathode 652, organic compound layer 655 formed on the inorganic conductive layer 654, and the anode 656 formed on the organic compound layer 655 and the insulating layer 653 can be formed.

Note that, in the process of manufacturing the light emitting device in this embodiment, although the source signal lines are formed by materials which form the gate electrodes, and although the gate signal lines are formed by wiring materials which forms the source and drain electrodes, with relation to the circuit structure and process, other materials may also be used.

Further, a driver circuit 705 having an n-channel TFT 701 and a p-channel TFT 702, and a pixel portion 706 having a switching TFT 703 and a current control TFT 704 can be formed on the same substrate.

The n-channel TFT 701 of the driver circuit 705 has the channel forming region 501, the low concentration impurity region 631 (GOLD region) which overlaps with the first conductive layer 626a forming a portion of the gate electrode, and the high concentration impurity region 635 which functions as a source region or a drain region. The p-channel TFT 702 has the channel forming region 502, and the impurity regions 641 and 642 that function as source regions or drain regions.

The switching TFT 703 of the pixel portion 706 has the channel forming region 503, the low concentration impurity region 633a (LDD region) which overlap with the first conductive layer 628a, the low concentration impurity region 633b (LDD region) which does not overlap with the first conductive layer 628a, and the high concentration impurity region 637 which functions as a source region or a drain region.

The current control TFT 704 of the pixel portion 706 has the channel forming region 504, the low concentration impurity region 634a (LDD region) which overlap with the first conductive layer 629a, the low concentration impurity region 634b (LDD region) which does not overlap with the first conductive layer 628a, and the high concentration impurity region 638 which function as source regions or drain regions.

In this embodiment, the driving voltage of a TFT is 1.2 to 10 V, preferably 2.5 to 5.5 V.

When the display of the pixel portion is active (case of the moving picture display), a background is displayed by pixels in which the light emitting elements emit light and a character is displayed by pixels in which the light emitting elements do not emit light. However, in the case where the moving picture display of the pixel portion is still for a certain period or more (referred to as a standby time in the present specification), for the purpose of saving electric power, it is appropriate that a display method is changed (inverted). Specifically, a character is displayed by pixels in which EL elements emit light (also called a character display), and a background is displayed by pixels in which light emitting elements do not emit light (also called a background display).

Figure 10A:
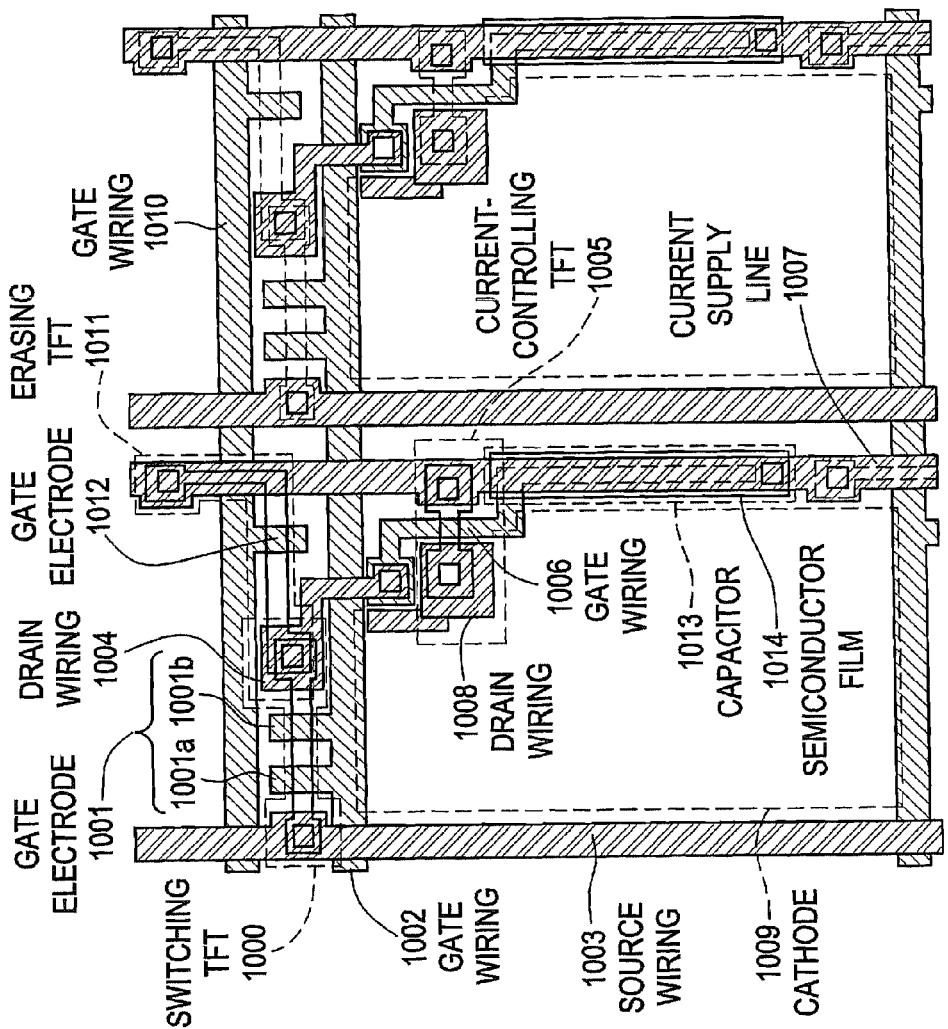
FIGS. 10A and 10B are top view of a pixel section of a luminous device, and a sectional view thereof.
Figure 10B:
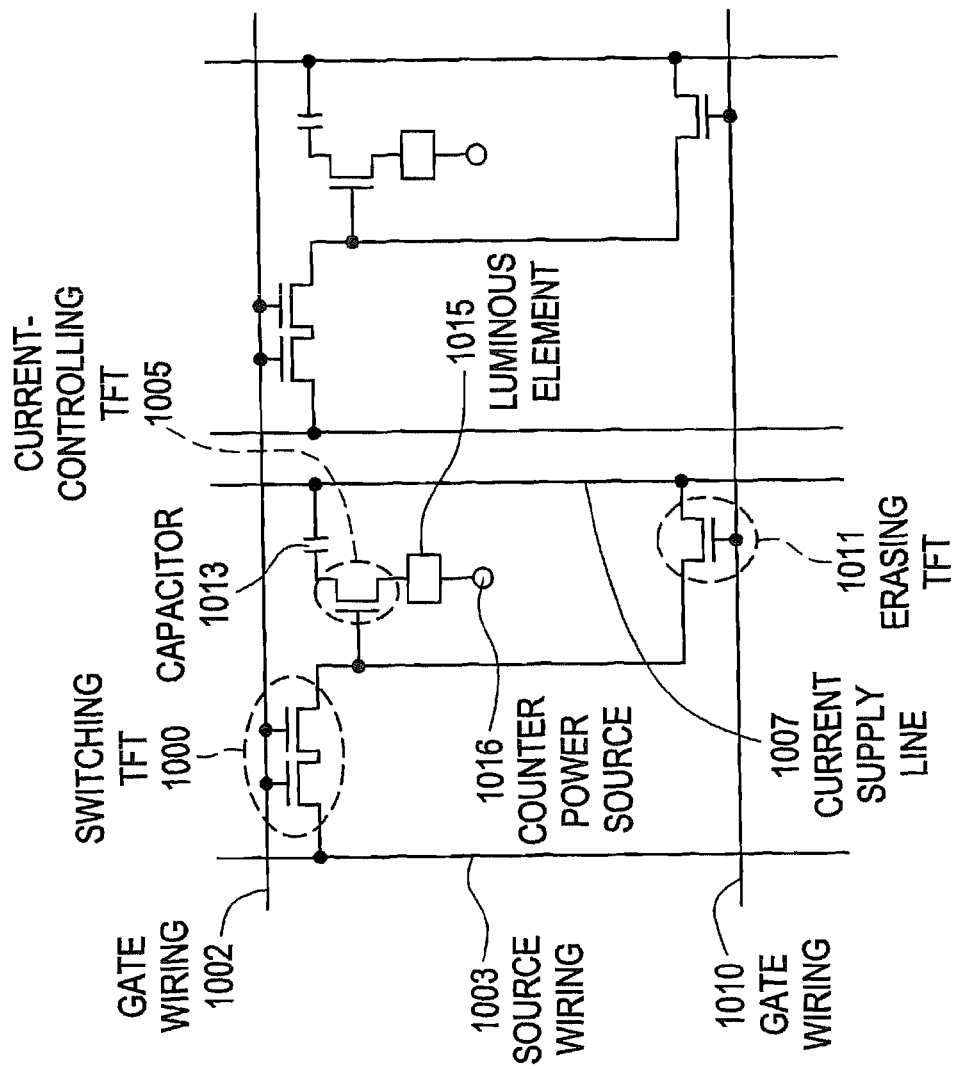

A detailed top surface structure of a pixel portion is shown in FIG. 10A, and a circuit diagram thereof is shown in FIG. 10B. FIGS. 10A and 10B denoted by a same reference numerals.

In FIGS. 10A and 10B, a switching TFT 1000 provided on a substrate is formed by using the switching TFT (n-channel type) TFT 703 of FIG. 8. Therefore, an explanation of the switching (n-channel type) TFT 703 may be referred for an explanation of the structure. Further, a wiring indicated by reference numeral 1002 is a gate wiring for electrically connecting with gate electrodes 1001 (1001a and 1001b) of the switching TFT 1000.

Note that, in this embodiment, a double gate structure is adopted, in which two channel forming regions are formed, but a single gate structure, in which one channel forming region is formed, or a triple gate structure, in which three channel forming regions are formed, may also be adopted.

Further, a source of the switching TFT 1000 is connected to a source wiring 1003, and a drain thereof is connected to a drain wiring 1004. The drain wiring 1004 is electrically connected with a gate electrode 1006 of a current control TFT 1005. Note that the current control TFT 1005 is formed by using the current control (n-channel type) TFT 704 of FIG. 8. Therefore, an explanation of the current control (n-channel type) TFT 704 may be referred for an explanation of the structure. Note that, although the single gate structure is adopted in this embodiment, the double gate structure or the triple gate structure may also be adopted.

Further, a source of the current control TFT 1005 is electrically connected with a current supply line 1007, and a drain thereof is electrically connected with a drain wiring 1008. Besides, the drain wiring 1008 is electrically connected with a cathode 1009 indicated by a dotted line.

A wiring indicated by reference numeral 1010 is a gate wiring connected with the gate electrode 1012 of the erasing TFT 1011. Further, a source of the erasing TFT 1011 is electrically connected to the current supply line 1007, and a drain thereof is electrically connected to the drain wiring 1004.

The erasing TFT 1011 is formed like a current controlling TFT (n-channel type) 704 in FIG. 8. Therefore, an explanation of the structure is referred to that of the current controlling TFT (n-channel type) 704. In this embodiment, a single gate structure is described though, a double gate structure or a triple gate structure can be used.

At this time, a storage capacitor (condenser) is formed in a region indicated by reference numeral 1013. The capacitor 1013 is formed by a semiconductor film 1014 electrically connected with the current supply line 1007, an insulating film (not shown) of the same layer as a gate insulating film, and the gate electrode 1006. Further, a capacitor formed by the gate electrode 1006, the same layer (not shown) as a first interlayer insulating film, and the current supply line 1007 may be used as a storage capacitor.

The light emitting element 1015 shown in circuit diagram in FIG. 10B is composed of the cathode 1009, an organic compound layer (not illustrated) formed on the cathode 1009, and an anode (not illustrated) formed on the organic compound layer. In the present invention, the cathode 1009 is connected with a source region and a drain region of the current controlling TFT 1005.

A counter potential is supplied to the anode of the light emitting element 1005. In addition, the power source potential is supplied to the power supply line 1007. A potential difference between the counter potential and the power source potential is always maintained at such a level that causes the light emitting element to emit light when the power source potential is applied to the pixel electrode. The power source potential and the counter potential are supplied to the light emitting device of the present invention by means of a power source provided by an externally-attached IC chip or the like. In the present specification, the power source supplying a counter potential is referred to as the counter power source 1016.

Example 3

Referring to FIG. 11, the external appearance of an active matrix type luminescent device of the present invention will be described in the present example.

FIG. 11A is a top view of the luminescent device, and FIG. 11B is a sectional view taken on line A-A' of FIG. 11A. Reference number 1101 represents a source side driving circuit, which is shown by a dotted line; 1102, a pixel section; 1103, a gate side driving circuit; 1104, a cover material; and 1105, a sealant. A space is surrounded by the sealant 1105.

Reference number 1108 represents an interconnection for transmitting signals inputted to the source signal line driving circuit 1101 and the gate signal line driving circuit 1103. The interconnection 1108 receives video signals or clock signals from a flexible print circuit (FPC) 1109, which will be an external input terminal. Only the FPC is illustrated, but a printed wiring board (PWB) may be attached to this FPC. The luminescent device referred to in the present specification may be the body of the luminescent device, or a product wherein an FPC or a PWB is attached to the body.

The following will describe a sectional structure, referring to FIG. 11B. The driving circuits and the pixel section are formed on the substrate 1110, but the source side driving circuit 1101 as one of the driving circuits and the pixel section 1102 are shown in FIG. 11B.

In the source side driving circuit 1101, a CMOS circuit wherein an n-channel type TFT 1113 and a p-channel type TFT 1114 are combined is formed. The TFTs constituting the driving circuit may be composed of known CMOS circuits, PMOS circuits or NMOS circuits. In the present example, a driver-integrated type, wherein the driving circuit is formed on the substrate, is illustrated, but the driver-integrated type may not necessarily be adopted. The driver may be fitted not to the substrate but to the outside.

The pixel section 1102 is composed of plural pixels including a current-controlling TFT 1111 and an anode 1112 electrically connected to the drain of the TFT 1111.

On the both sides of the anode 1112, insulators 1113 are formed, and an organic compound layer 1114 is formed on the anode 1112. Furthermore, non-organic conductive layer 1116 is formed on the organic compound layer 1114 and a cathode 1117 is formed on the non-organic conductive layer 1116. In this way, a luminescent element 1118 composed of the anode 1112, the organic compound layer 1114 and the cathode 1117 is formed.

The cathode 1117 also functions as an interconnection common to all of the pixels, and is electrically connected through the interconnection 1108 to the FPC 1109.

In order to confine the luminescent element 1118 formed on the substrate 1110 airtightly, the cover material 1104 is adhered with the sealant 1105. A spacer made of a resin film may be set up to keep a given interval between the cover material 1104 and the luminescent element 1018. An inert gas such as nitrogen is filled into the space 1107 inside the sealant 1105. As the sealant 1105, an epoxy resin is preferably used. The sealant 1105 is desirably made of a material through which water content or oxygen is transmitted as slightly as possible. Furthermore, it is allowable to incorporate a material having moisture absorption effect or a material having antioxidation effect into the space 1107.

In the present example, as the material making the cover material 1104, there may be used a glass substrate, a quartz substrate, or a plastic substrate made of fiber glass-reinforced plastic (FRP), polyvinyl fluoride (PVF), mylar, polyester or polyacrylic resin.

After the adhesion of the cover material 1104 to the substrate 1110 with the sealant 1105, a sealant is applied so as to cover the side faces (exposure faces).

As described above, the luminescent element is airtightly put into the space 1107, so that the luminescent element can be completely shut out from the outside and materials promoting deterioration of the organic compound layer, such as water content and oxygen, can be prevented from invading this layer from the outside. Consequently, the luminescent device can be made highly reliable.

The structure of the present example may be freely combined with the structure of example 1 or 2.

Example 4

Example 1 to 3 describes an active matrix type luminescent device having a top gate transistor. However, the transistor structure of the present invention is not limited thereto and bottom gate transistors (typically reverse stagger transistors) may also be used in carrying out the present invention as shown in FIG. 12. The reverse stagger transistors may be formed by any method.

Figure 12A:
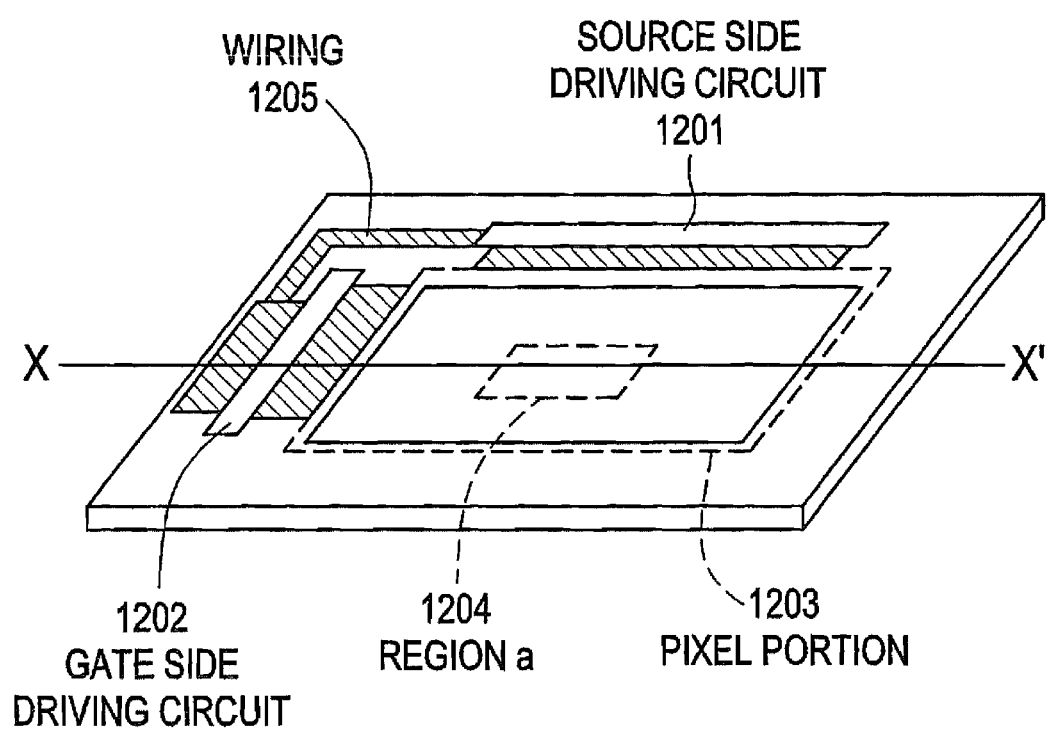
FIGS. 12A and 12B are views for explaining a structure of a reverse stagger type TFT.
Figure 12B:
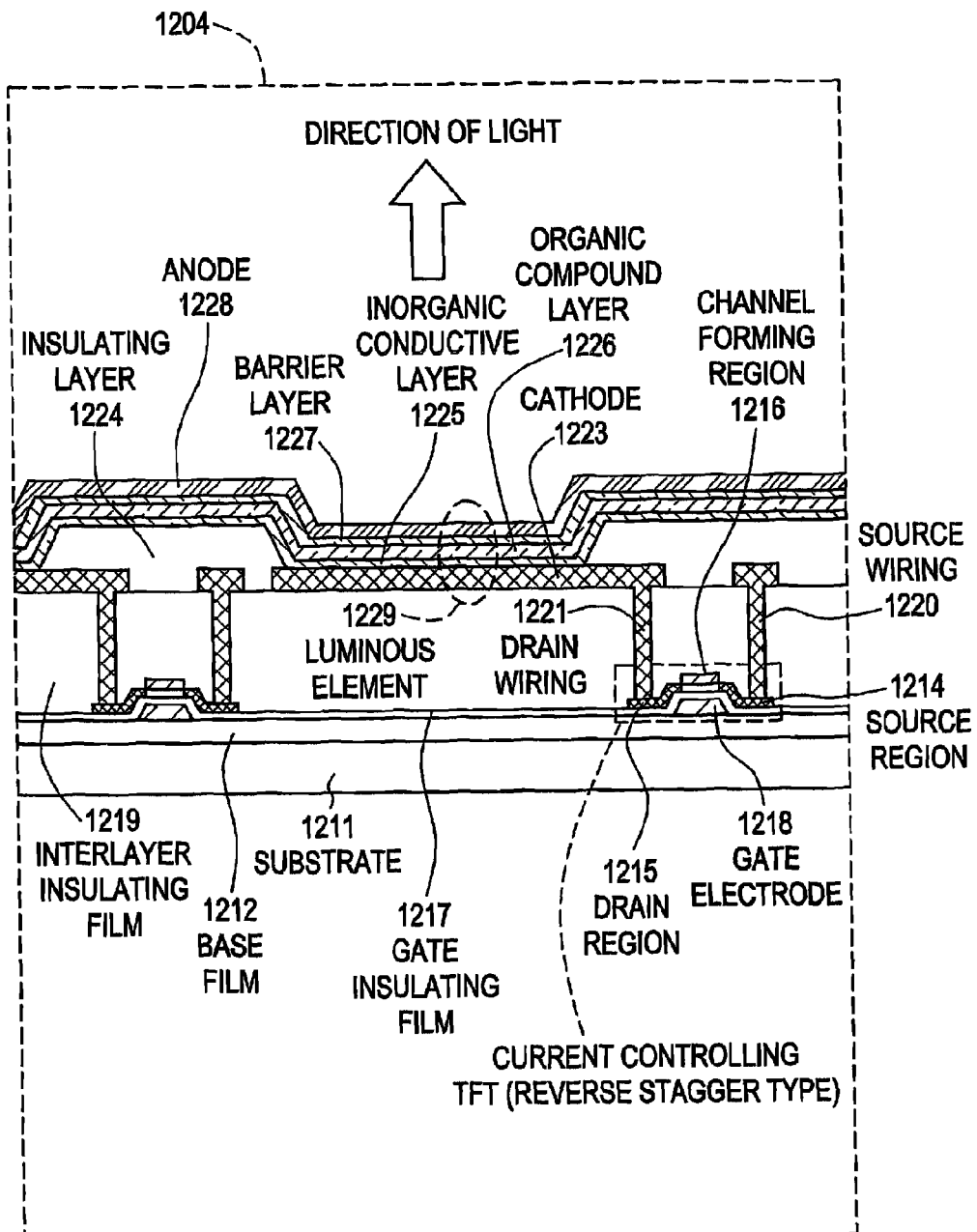

FIG. 12A is a top view of a light emitting device that uses bottom gate transistors. Note that the sealing in not conducted yet by sealing substrate. A source side driving circuit 1201, a gate side driving circuit 1202, and a pixel portion 1203 are formed therein. FIG. 12B shows in section a region a 1204 of the pixel portion 1203. The sectional view is obtained by cutting the light emitting device along the line x-x' in FIG. 12A.

FIG. 12B illustrates only a current controlling transistor out of transistors that constituted in a pixel portion 1203. Reference symbol 1211 denotes a substrate and 1212 denotes an insulating film to serve as a base (hereinafter referred to as a base film). A transparent substrate is used for the substrate 1211, typically, a glass substrate, a quartz substrate, a glass ceramic substrate, or a crystallized glass substrate. However, the one that can withstand the highest process temperature during the manufacture process has to be chosen.

The base film 1212 is effective especially when a substrate containing a movable ion or a conductive substrate is used. If a quartz substrate is used, the base film may be omitted. An insulating film containing silicon is used for the base film 1212. The term insulating film containing silicon herein refers to an insulating film containing oxygen or nitrogen in a given ratio to the content of silicon, specifically, a silicon oxide film, a silicon nitride film, or a silicon oxynitride film (SiOxNy: x and y are arbitrary integers).

Reference symbol 1213 denotes a current controlling transistor that is a p-channel transistor. Note that, in this example, cathode 1223 of luminescent element 1229 is connected the current control transistor 1213. Therefore, the cathode 1223 are preferably made from p-channel TFT but also made from n-channel TFT.

The current controlling transistor 1213 is composed of an active layer which comprising source region 1214, drain region 1215 and channel forming region 1216, a gate insulating film 1217, a gate electrode 1218, a interlayer insulating film 1219, a source wiring line 1220, and a drain wiring line 1221. The current controlling transistor 1213 in this example is a p-channel transistor.

The switching transistor has a drain region connected to the gate electrode 1218 of the current controlling transistor 1213. The gate electrode 1218 of the current controlling transistor 1213 is electrically connected to the drain region (not shown) of the switching transistor through a drain wiring line (not shown), to be exact. The gate electrode 1218 has a single gate structure but may take a multi-gate structure. The source wiring line 1220 of the current controlling transistor 1213 is connected to a current supplying line (not shown).

The current controlling transistor 1213 is an element for controlling the amount of current supplied to the EL element, and a relatively large amount of current flows through this transistor. Therefore, it is preferable to design the current controlling transistor to have a channel width (W) wider than the channel width of the switching transistor. It is also preferable to design the current controlling transistor to have a rather long channel length (L) in order to avoid excessive current flow in the current controlling transistor 1213. Desirably, the length is set such that the current is 0.5 to 2 μA (preferably 1 to 1.5 μA) per pixel.

If the active layer (channel formation region, in particular) of the current controlling transistor 1213 is formed thick (desirably 50 to 100 nm, more desirably 60 to 80 nm), degradation of the transistor can be slowed.

After the current controlling transistor 1213 is formed, the interlayer insulating film 1219 is formed and cathode 1223 that is electrically connected to the current controlling transistor 1213 is formed. In this example, the current controlling transistor 1213, the wiring that connects the cathode 1223 electrically and cathode 1223 are formed at the same time and same material. As the materials of cathode 1223, the conductive film having small working function is preferably used. In this example, the cathode 1223 formed from Al.

After the cathode 1223 is formed, an insulating film 1224 is formed. The insulating film 1224 serves as a so-called bank.

A non-organic conductive layer 1225 is formed next. Note that in this example, the luminescent element has the same structure as the one described in example 1. Barrier layer 1227 is formed on the organic compound layer 1226 and the organic compound layer 1226 is formed on the non-organic conductive layer 1225. Note that, as the materials of non-organic conductive layer 1225, organic compound layer 1226 and barrier layer 1227, the materials described in example 1 can be used.

Next, an anode 1228 is formed on the barrier layer 1227. As the materials of anode 1228, a transparent conductive film is used. Note that, in this example, anode 1228 is formed from ITO for 110 nm thickness.

Then, A light emitting device having a reverse stagger transistor structure complete. The light emitting device manufactured in accordance with this example emits light in the direction indicated by the arrow in FIG. 12B (toward the top face).

A reverse stagger transistor can be fabricated with a smaller number of manufacture steps than needed to fabricate a top gate transistor. Therefore it is very advantageous for cost down, which is one of the objects of the present invention.

This example describes the light emitting device having the element structure that having a reverse stagger type TFT and light is emitted from cathode side of luminescent element. But the reverse stagger type TFT of this example also combined with the various luminescent elements showed in example 1. Further, this example may be combined freely with any of the manufacturing method or materials of Examples 2 and sealing structure of Example 3.

Example 5

Figure 13:
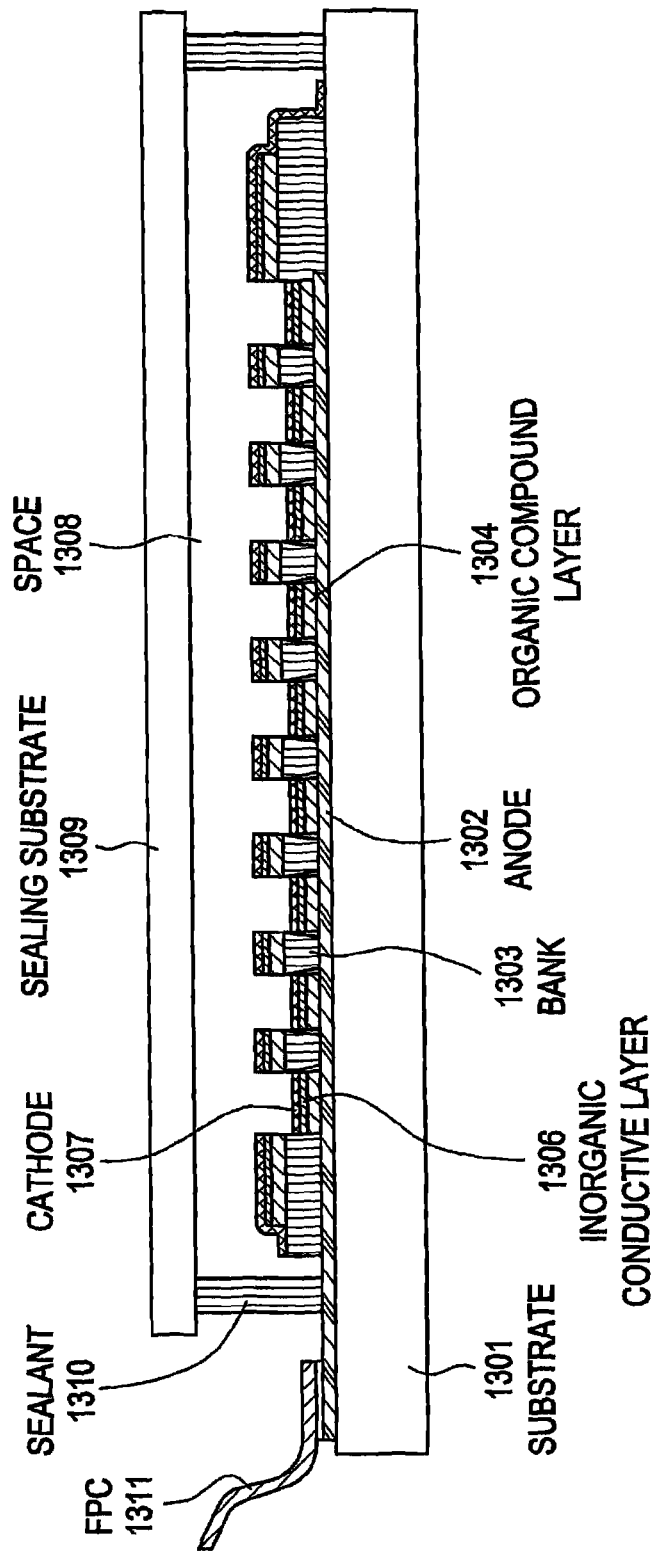
FIG. 13 is a view for explaining a passive matrix type luminous device.

In the present example, a case in which a passive type (simple matrix type) luminous device having an element structure of the present invention is produced will be described, referring to FIG. 13. In FIG. 13, reference numbers 1301 and 1302 represent a glass substrate and an anode made of a transparent conductive film, respectively. In the present example, a compound of indium oxide and zinc oxide is formed for the transparent conductive film by vapor deposition. A plurality of the anodes 1302, which are not illustrated in FIG. 13, are arranged in the form of stripe parallel to the paper face.

Banks 1303 made of an insulating material are formed to cross the anode 1302 arranged in the stripe form. The banks 1303 are formed perpendicularly to the paper face to contact the anodes 1302.

Next, an organic compound layer 1304 is formed. As the material which makes the organic compound layer 1304, a known material which can give luminescence, as well as the materials described in Examples 1 and 2, can be used.

For example, by forming an organic compound layer giving red luminescence, an organic compound layer giving green luminescence, and an organic compound layer giving blue luminescence, a luminous device giving three types of luminescence rays can be formed. Since the organic compound layer 1304 composed of these layers is formed along grooves made in the banks 1303, the layer 1304 is arranged in the stripe form perpendicular to the paper face.

In the structure of the luminous element in the present example, an inorganic conductive layer 1306 is formed by vacuum vapor deposition after the formation of the organic compound layer 1304.

Next, a cathode 1307 is formed. The cathode 1307 is formed on the inorganic conductive layer 1306 by vapor deposition using a metal mask.

Since the lower electrodes (the anodes 1302) are transparent anodes in the present example, light generated in the organic compound layer is radiated downward (from the substrate 1301).

Next, a ceramic substrate is prepared as a sealing substrate 1309. Since the sealing substrate 1309 may have light-shading property in the structure of the present example, the ceramic substrate is used. However, a substrate made of plastic or glass may be used.

The thus-prepared sealing substrate 1309 is adhered to the substrate 1301 with a sealant 1310 made of an ultraviolet hardening resin. The inside 1308 of the sealant 1310 is an airtightly-closed space, and the inside is filled with an inert gas such as nitrogen or argon. It is effective to put a moisture absorbent, a typical example of which is barium oxide, in the airtightly closed space 1308. At last, a flexible printed circuit (FPC) 1311 is fitted to the anodes to complete a passive type luminous device. The present example may be carried out in the state that the materials described in Examples 1 and 2 may be freely combined in the present example to form the organic compound layer, or the sealing structure described in Example 3 is applied to the present example.

Example 6

Being self-luminous, a light emitting device using a light emitting element has better visibility in bright places and wider viewing angle than liquid crystal display devices. Therefore various electric appliances can be completed by using the light emitting device of the present invention.

Given as examples of an electric appliance that employs a light emitting device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices with a display device that can reproduce data in a recording medium such as a digital video disk (DVD) to display an image of the data). Wide viewing angle is important particularly for portable information terminals because their screens are often slanted when they are looked at. Therefore it is preferable for portable information terminals to employ the light emitting device using the light emitting element. Specific examples of these electric appliance are shown in FIGS. 14A to 14H.

Figure 14A:
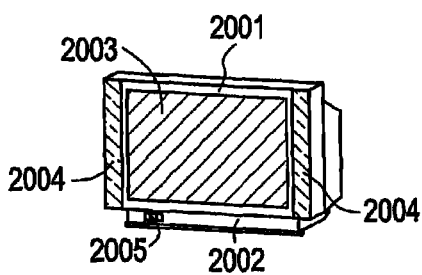
FIGS. 14A to 14H are views illustrating examples of electrical apparatus.

FIG. 14A shows a display device, which is composed of a case 2001, a support base 2002, a display unit 2003, speaker units 2004, a video input terminal 2005, etc. The light emitting device manufactured in accordance with the present invention can be applied to the display unit 2003. Since the light emitting device having the light emitting element is self-luminous, the device does not need back light and can make a thinner display unit than liquid crystal display devices. The display device refers to all display devices for displaying information, including ones for personal computers, for TV broadcasting reception, and for advertisement.

Figure 14B:
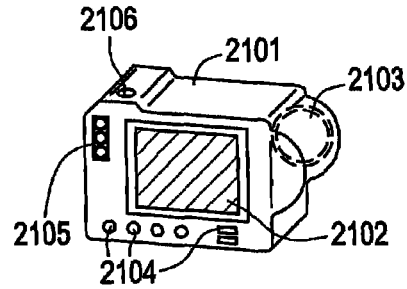

FIG. 14B shows a digital still camera, which is composed of a main body 2101, a display unit 2102, an image receiving unit 2103, operation keys 2104, an external connection port 2105, a shutter 2106, etc. The light emitting device manufactured in accordance with the present invention can be applied to the display unit 2102.

Figure 14C:
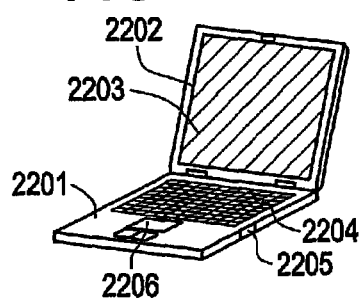

FIG. 14C shows a notebook personal computer, which is composed of a main body 2201, a case 2202, a display unit 2203, a keyboard 2204, an external connection port 2205, a pointing mouse 2206, etc. The light emitting device manufactured in accordance with the present invention can be applied to the display unit 2203.

Figure 14D:
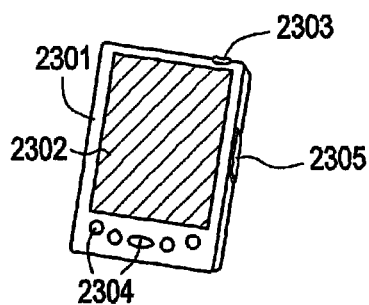

FIG. 14D shows a mobile computer, which is composed of a main body 2301, a display unit 2302, a switch 2303, operation keys 2304, an infrared port 2305, etc. The light emitting device manufactured in accordance with the present invention can be applied to the display unit 2302.

Figure 14E:
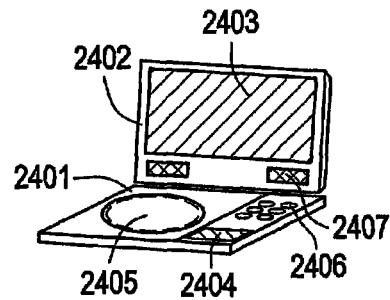

FIG. 14E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The image reproducing device equipped with a recording medium also includes home-video game machines.

Figure 14F:
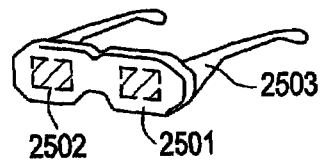

FIG. 14F shows a goggle type display (head mounted display), which is composed of a main body 2501, display units 2502, and arm units 2503. The light emitting device manufactured in accordance with the present invention can be applied to the display units 2502.

Figure 14G:
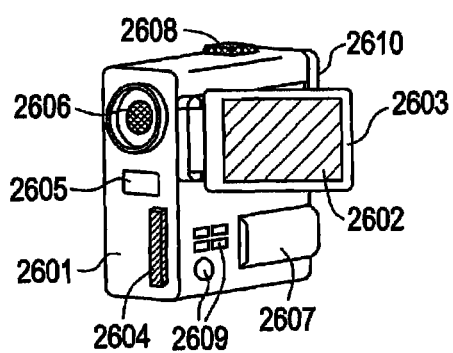

FIG. 14G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The light emitting device manufactured in accordance with the present invention can be applied to the display unit 2602.

Figure 14H:
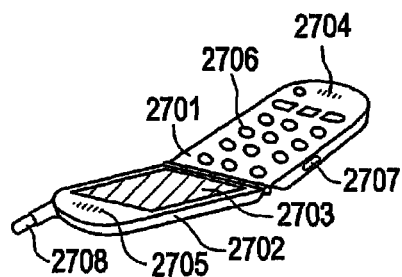

FIG. 14H shows a cellular phone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 2703 displays white letters on black background, the cellular phone consumes less power.

If the luminance of light emitted from organic materials is raised in future, the light emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since organic materials have very fast response speed, the light emitting device is suitable for animation display.

In the light emitting device, light emitting portions consume power and therefore it is preferable to display information in a manner that requires less light emitting portions. When using the light emitting device in display units of portable information terminals, particularly cellular phones and audio reproducing devices that mainly display text information, it is preferable to drive the device such that non-light emitting portions form a background and light emitting portions form text information.

As described above, the application range of the light emitting device manufactured by using the deposition device of the present invention is so wide that it is applicable to electric appliances of any field. The electric appliances of this embodiment can employ as their display units any light emitting device shown in Embodiments 1 to 5, which is formed by the deposition method shown in Embodiments 1 to 3.

Example 7

In the present example, results obtained by measuring element characteristics of the following structures will be described: (1) a conventional luminous element structure in which an alloy containing an alkali metal, which has a small work function, is used for its cathode; (2) a conventional luminous structure wherein a conventional cathode buffer layer (insulating material) is set between its cathode and its organic compound layer; and (3) a structure of the present invention wherein an inorganic conductive layer is used as a part of a luminous element to form the element.

About the element characteristic of the luminous element structure (1) wherein an alloy containing an alkali metal, which has a small work function, was used for its cathode, an alloy of aluminum and lithium (Al:Li alloy) was used for the cathode of the luminous element to produce the luminous element. The current characteristic and the voltage characteristic in this case are shown in FIGS. 15A and 15B, respectively. The structure of the produced element was as follows: Al:Li (100 nm) (cathode)/Alq$_3$ (50 nm)/α-NPD (30 nm)/Cu-Pc (20 nm)/ITO (anode).

As the current characteristic, a luminance of 1000 cd/m$^2$ was obtained at 20 mA/cm$^2$. As the voltage characteristic, a luminance of 1000 cd/m$^2$ was obtained at 7 V.

Figure 16A:
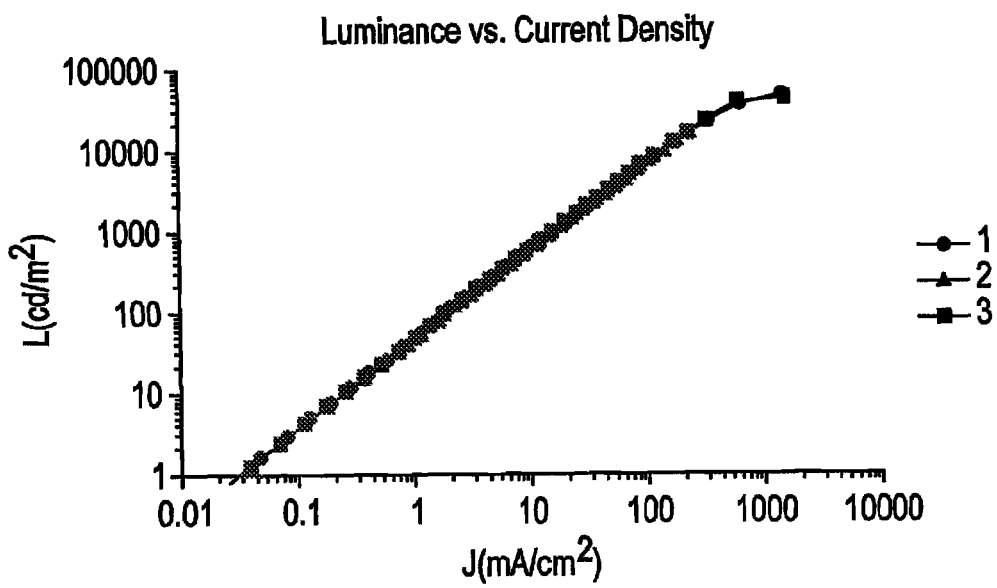
FIGS. 16A and 16B are graphs showing results obtained by measuring the element characteristics of a conventional luminous element.
Figure 16B:
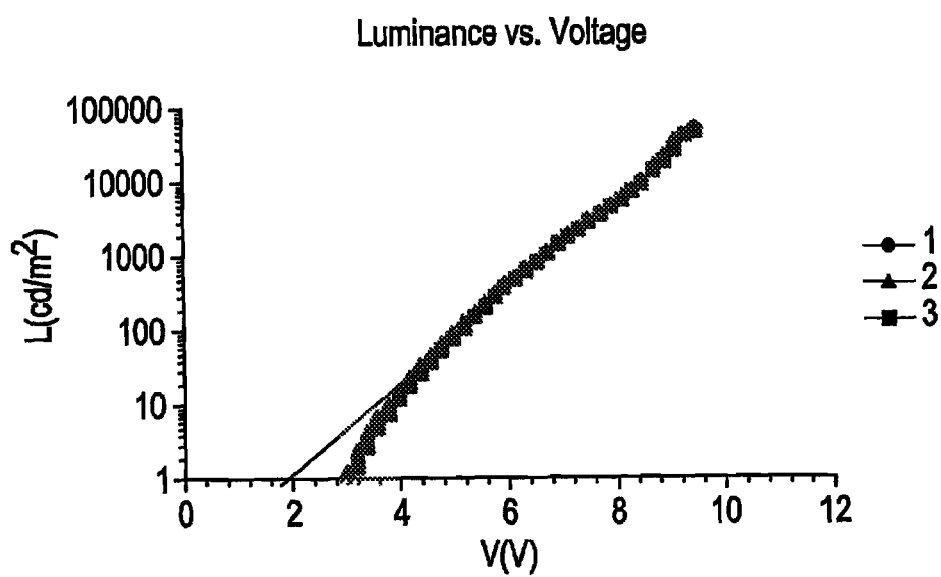

About the electric characteristics of the luminous element structure (2) wherein a conventional cathode buffer layer (insulating material) was set between its cathode and its organic compound layer, a cathode buffer layer (LiF) was set between the cathode and the organic compound layer of the luminous element, to produce the element. The current characteristic and the voltage characteristics in this case are shown in FIGS. 16A and 16B, respectively. The structure of the produced element was as follows: Al(100 nm) (cathode)/LiF (1 nm)(cathode buffer)/Alq$_3$ (50 nm)/α-NPD (30 nm)/Cu-Pc (20 nm)/ITO (anode).

The current characteristic was substantially the same as in the case using the Al:Li alloy as the cathode, and a brightness of 1000 cd/m$^2$ was obtained at 25 mA/cm$^2$. As the voltage characteristics, a luminance of 1000 cd/m$^2$ was obtained at 7 V in the same manner.

Figure 17A:
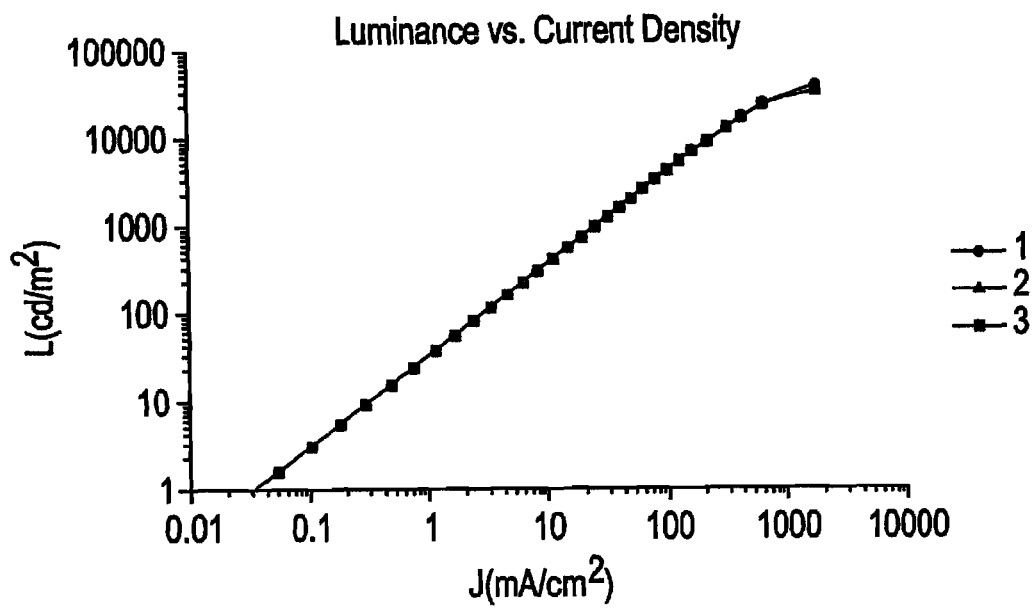
FIGS. 17A and 17B are graphs showing results obtained by measuring the element characteristics of a luminous element of the present invention.
Figure 17B:
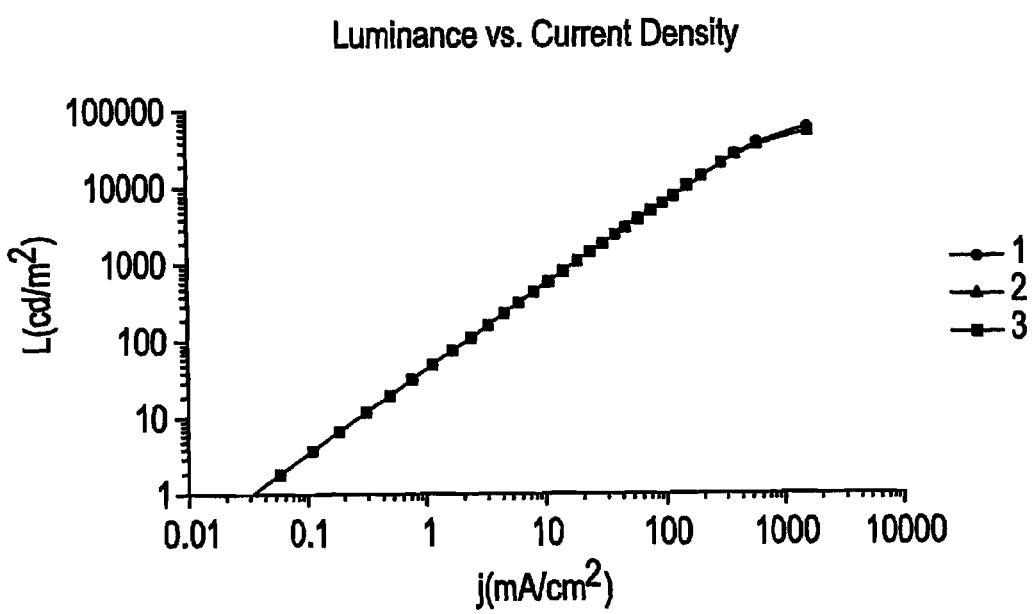
Figure 18A:
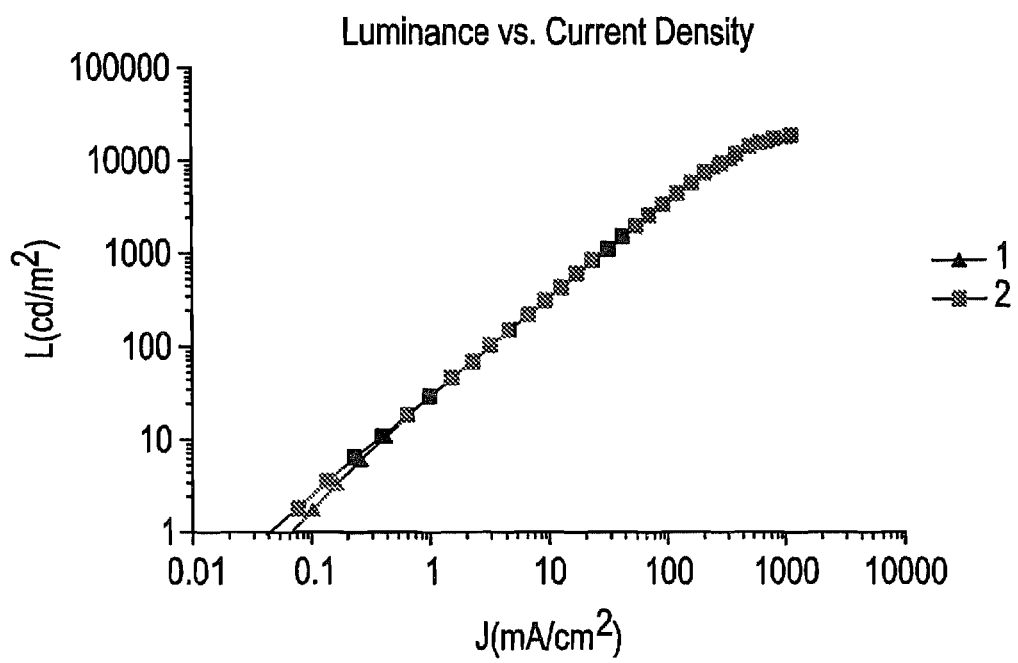
FIGS. 18A and 18B are graphs showing results obtained by measuring the element characteristics of a luminous element of the present invention.
Figure 18B:
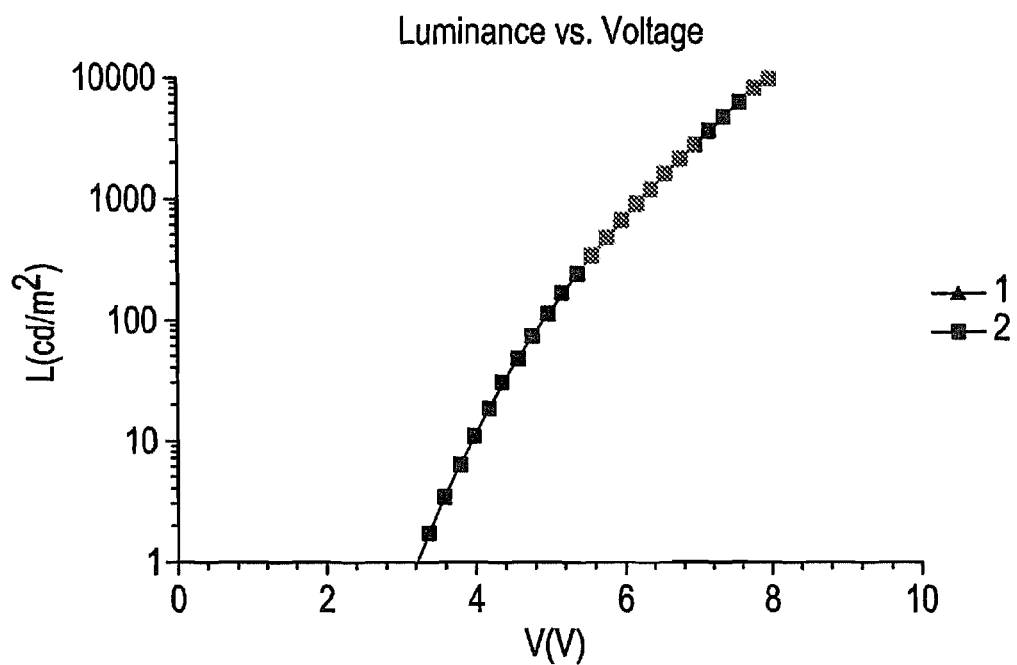
Figure 19A:
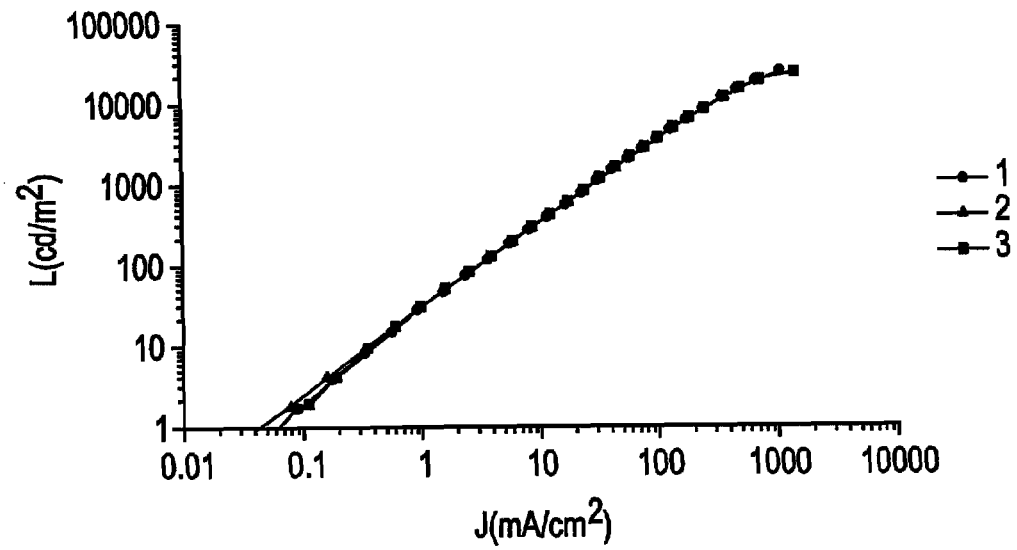
FIGS. 19A and 19B are graphs showing results obtained by measuring the element characteristics of a luminous element of the present invention.
Figure 19B:
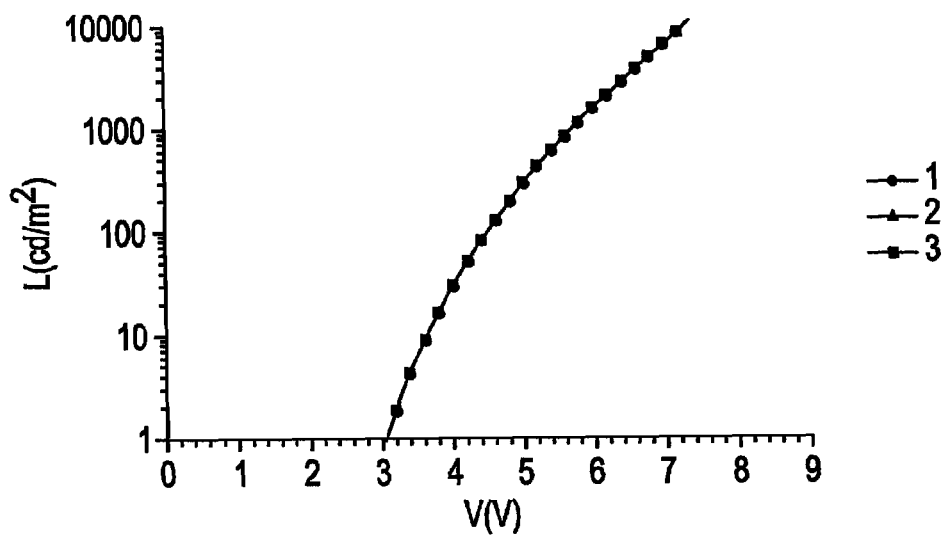

About the element characteristic of the structure (3) wherein an inorganic conductive layer was used as a part of a luminous element to form the element, a conductive film made of each of inorganic compounds (Ca$_3$N$_2$, Mg$_2$N$_3$ and MgB$_2$) was formed between the cathode and the organic compound layer of the luminous element. The current characteristic and the voltage characteristic of these luminous elements having the structure of the present invention are shown in FIGS. 17 to 19. The structure of the produced luminous element is as follows: Al(100 nm) (cathode)/conductive film (Ca$_3$N$_2$, Mg$_2$N$_3$ or MgB$_2$) (100 nm)/Alq$_3$ (50 nm)/α-NPD (30 nm)/Cu-Pc (20 nm)/ITO (anode).

In the luminous elements using the inorganic conductive film having the above-mentioned structure as their one part, a luminance of 1000 cd/m$^2$ can be obtained at 25 mA/cm$^2$ even if any one of the inorganic materials is used. As the voltage characteristic thereof, a luminance of 1000 cd/m" was obtained at 6.5 V. This is the same as in the conventional luminous elements ((1) the conventional luminous element structure in which the alloy containing an alkali metal, which has a small work function, was used for its cathode; and (2) the conventional luminous structure wherein the conventional cathode buffer layer (insulating material) was set between its cathode and its organic compound layer), and demonstrates that the inorganic conductive layer of the present invention produces no bad effect on element characteristics when compared with the conventional element structures.

About the three materials of calcium nitride, magnesium nitride and magnesium boride, the resistivity and the work function thereof were measured. The resistivity was obtained by forming aluminum electrodes at intervals of 1.9 cm, forming a film made of each of the above-mentioned three materials (film thickness: 70 nm, 30 nm and 40 nm in the case of $Ca_3N_2$, $Mg_3N$, and $MgB_2$, respectively) between the electrodes to have a thickness of 3 cm, and then measuring the resistance value thereof with a tester.

The work function was measured using a contact voltage measuring method (measuring device: Fermi level measuring device FAC-1 (made by Riken Keiki Co., Ltd.)). The results are shown in Table 1.

TABLE 1

| | $\rho[10^{-6} \Omega cm]$ | $\Phi[eV]$ |
|---|---|---|
| $Ca_3N_2$ | 7.7 | Less than 3.1 |
| $Mg_3N_2$ | 230 | 3.7 |
| $MgB_2$ | 150 | 3.8 |

The inorganic conductive layer in the present invention is a conductive film made of an inorganic compound containing an element belonging to the II group in the periodic table, such as a nitride, a sulfide, or a boride. In the present invention, therefore, the diffusion of an alkali metal, which is said to produce a bad effect on the properties of a TFT, can be still more prevented than in cases in which an alloy containing an alkali metal, which has a small work function, is used as a cathode material. Furthermore, in the present invention, the conductive layer is made of a material having electric conductivity. Therefore, the present invention can overcome a problem that the layer becomes thinner when a cathode buffer layer made of a conventional insulating material is used, without producing any effect on element characteristics. In other words, by using an inorganic conductive layer in a luminous element in the present invention, the above-mentioned advantageous effects can be obtained while the same properties as in the case using conventional cathode material and a conventional cathode buffer layer are maintained.

In the present invention, an inorganic conductive layer made of an inorganic compound having a small work function and electric conductivity is formed between a cathode and an organic compound layer, whereby it becomes unnecessary to make the film extremely thin. Therefore, the film thickness can easily be controlled and a problem of scattering between elements can be solved.

Furthermore, in the present invention, a conductive inorganic compound containing an element belonging to the II group in the periodic table is used to form the inorganic conductive layer; therefore, when the present invention is compared with cases in which an element belonging to the II group in the periodic table is used as a single substance, diffusion thereof into the luminous element can be further reduced. Moreover, a luminous element having a strong resistance against deterioration due to oxygen can be formed since the inorganic compound has lower reactivity with oxygen than the single substance.

What is claimed is:

1. A luminous device comprising:
    a substrate;
    an anode provided over the substrate;
    an organic compound layer provided over the anode;
    a conductive film comprising an inorganic compound provided over the organic compound layer; and
    a cathode over the conductive film,
    wherein the anode comprises a conductive material having a light shading property and a reflectivity, and
    wherein a light generated in the organic compound layer is emitted from a side of the cathode.

2. A luminous device according to claim 1 wherein the cathode and the conductive film have a transmissivity of 70% or more in the visible ray.

3. A luminous device according to claim 1 wherein the anode comprises a transparent conductive film over the conductive material.

4. A luminous device according to claim 1 wherein the conductive material is a material comprising one selected from the group consisting of aluminum, titanium and tungsten.

5. A luminous device according to claim 1 wherein the cathode has a thickness of 1 to 20 nm.

6. A luminous device according to claim 1 wherein the inorganic compound is a compound selected from the group consisting of:
    (a) a compound of silicon and one element selected from the group consisting of magnesium, calcium, strontium and barium, and
    (b) a boride containing a rare earth element.

7. A luminous device comprising:
    a substrate;
    an anode provided over the substrate;
    an organic compound layer provided over the anode;
    a conductive film comprising an inorganic compound provided over the organic compound layer; and
    a cathode over the conductive film,
    wherein the anode comprises a first electrode and a second electrode over the first electrode,
    wherein the first electrode comprises a conductive material having a light shading property and a reflectivity, and
    wherein a light generated in the organic compound layer is emitted from a side of the cathode.

8. A luminous device according to claim 7 wherein the cathode and the conductive film have a transmissivity of 70% or more in the visible ray.

9. A luminous device according to claim 7 wherein the second electrode has a high work function.

10. A luminous device according to claim 7 wherein the conductive material is a material comprising one selected from the group consisting of aluminum, titanium and tungsten.

11. A luminous device according to claim 7 wherein the anode comprises a transparent conductive film.

12. A luminous device according to claim 7 wherein the inorganic compound is a compound selected from the group consisting of:
    (a) a compound of silicon and one element selected from the group consisting of magnesium, calcium, strontium and barium, and
    (b) a boride containing a rare earth element.

13. A luminous device comprising:
    a substrate;
    an anode provided over the substrate;
    an organic compound layer provided over the anode;
    a conductive film comprising an inorganic compound provided over the organic compound layer; and
    a cathode over the conductive film,
    wherein the anode comprises a conductive material having a light shading property and a reflectivity, and
    wherein a light generated in the organic compound layer is emitted through the cathode and the conductive film.

14. A luminous device according to claim 13 wherein the cathode and the conductive film have a transmissivity of 70% or more in the visible ray.

15. A luminous device according to claim 13 wherein the anode comprises a transparent conductive film over the conductive material.

16. A luminous device according to claim 13 wherein the conductive material is a material comprising one selected from the group consisting of aluminum, titanium and tungsten.

17. A luminous device according to claim 13 wherein the inorganic compound is a compound selected from the group consisting of:
  (a) a compound of silicon and one element selected from the group consisting of magnesium, calcium, strontium and barium, and
  (b) a boride containing a rare earth element.

* * * * *